United States Patent
Bao et al.

(10) Patent No.: US 10,418,288 B2
(45) Date of Patent: Sep. 17, 2019

(54) TECHNIQUES FOR FORMING DIFFERENT GATE LENGTH VERTICAL TRANSISTORS WITH DUAL GATE OXIDE

(71) Applicant: International Business Machines Corporation, Armonk, NY (US)

(72) Inventors: Ruqiang Bao, Niskayuna, NY (US); Shogo Mochizuki, Clifton Park, NY (US); Choonghyun Lee, Rensselaer, NY (US); Chun Wing Yeung, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/863,000

(22) Filed: Jan. 5, 2018

(65) Prior Publication Data
US 2019/0214305 A1    Jul. 11, 2019

(51) Int. Cl.
| | | |
|---|---|---|
| H01L 21/8238 | (2006.01) | |
| H01L 27/092 | (2006.01) | |
| H01L 21/308 | (2006.01) | |
| H01L 29/808 | (2006.01) | |
| H01L 27/24 | (2006.01) | |
| H01L 29/66 | (2006.01) | |
| H01L 29/78 | (2006.01) | |

(Continued)

(52) U.S. Cl.
CPC .. *H01L 21/82385* (2013.01); *H01L 21/28026* (2013.01); *H01L 21/3081* (2013.01); *H01L 21/3086* (2013.01); *H01L 21/823807* (2013.01); *H01L 21/823814* (2013.01); *H01L 21/823878* (2013.01); *H01L 27/0928* (2013.01); *H01L 27/2454* (2013.01); *H01L 29/66666* (2013.01); *H01L 29/7827* (2013.01); *H01L 29/7889* (2013.01); *H01L 29/8083* (2013.01)

(58) Field of Classification Search
CPC ............. H01L 29/7889; H01L 29/7827; H01L 29/66666; H01L 27/2454; H01L 29/8083; H01L 21/82385; H01L 29/7886
See application file for complete search history.

(56) References Cited

U.S. PATENT DOCUMENTS

| | | | |
|---|---|---|---|
| 6,632,712 B1 * | 10/2003 | Ang ................ | H01L 21/823885 257/328 |
| 7,534,669 B2 | 5/2009 | Anderson et al. | |

(Continued)

*Primary Examiner* — Selim U Ahmed
*Assistant Examiner* — Evan G Clinton
(74) *Attorney, Agent, or Firm* — Vazken Alexanian; Michael J. Chang, LLC

(57) ABSTRACT

Techniques for forming VFETs having different gate lengths (and optionally different gate pitch and/or gate oxide thickness) on the same wafer are provided. In one aspect, a method of forming a VFET device includes: patterning fins in a wafer including a first fin(s) patterned to a first depth and a second fin(s) patterned to a second depth, wherein the second depth is greater than the first depth; forming bottom source/drains at a base of the fins; forming bottom spacers on the bottom source/drains; forming gates alongside the fins, wherein the gates formed alongside the first fin(s) have a first gate length Lg1, wherein the gates formed alongside the second fin(s) have a second gate length Lg2, and wherein Lg1<Lg2; forming top spacers over the gates; and forming top source/drains over the top spacers. A VFET is also provided.

16 Claims, 23 Drawing Sheets

(51) Int. Cl.
*H01L 29/788* (2006.01)
*H01L 21/28* (2006.01)

(56) References Cited

U.S. PATENT DOCUMENTS

| | | |
|---|---|---|
| 9,000,537 B2 | 4/2015 | Cai et al. |
| 9,607,899 B1 * | 3/2017 | Cheng ............. H01L 21/823475 |
| 9,859,166 B1 * | 1/2018 | Cheng ............. H01L 21/823487 |
| 9,935,018 B1 * | 4/2018 | Xie ................. H01L 21/823885 |
| 2003/0008515 A1 | 1/2003 | Chen et al. |
| 2008/0128797 A1 | 6/2008 | Dyer et al. |
| 2016/0268256 A1 * | 9/2016 | Yang .................... H01L 27/088 |
| 2016/0336428 A1 * | 11/2016 | Cheng ............. H01L 29/66795 |

* cited by examiner

US 10,418,288 B2

TECHNIQUES FOR FORMING DIFFERENT GATE LENGTH VERTICAL TRANSISTORS WITH DUAL GATE OXIDE

FIELD OF THE INVENTION

The present invention relates to vertical field effect transistors (VFETs), and more particularly, to techniques for forming VFETs having different gate lengths (and optionally different gate pitch and/or gate oxide thickness) on the same wafer.

BACKGROUND OF THE INVENTION

Input/output (I/O) and analog transistors are important for processors and system on chip (SoC) devices since these devices are connected to the outside world and require I/O transistors that support higher bias voltages. For these high voltage applications, long channel I/O transistors (having an increased channel and gate length) can be employed.

A longer gate length (as compared to nominal transistor) reduces the magnitude of the lateral electric field in the channel region beneath the gate and thus reduces hot carrier injection to prevent degradation of the transistors' electrical performance. Analog devices also use a long gate length to reduce the random-dopant-fluctuation to improve the device reliability.

Vertical field effect transistors (VFETs) are being explored as a viable device option for continued complementary metal oxide semiconductor (CMOS) scaling beyond the 7 nanometer (nm) technology node. As opposed to planar CMOS devices, VFETs are oriented with a vertical fin channel disposed on a bottom source and drain and a top source and drain disposed on the fin channel. In vertical transistors, however, it is difficult to offer different gate lengths to fabricate long channel and analog devices.

Therefore, techniques for forming different gate lengths in VTFETs would be desirable.

SUMMARY OF THE INVENTION

The present invention provides techniques for forming vertical field effect transistors (VFETs) having different gate lengths (and optionally different gate pitch and/or gate oxide thickness) on the same wafer. In one aspect of the invention, a method of forming a VFET device is provided. The method includes: patterning fins in a first region and a second region of a wafer, wherein the fins include at least one first fin patterned to a first depth in the wafer and at least one second fin patterned to a second depth in the wafer, and wherein the second depth is greater than the first depth; forming bottom source and drains at a base of the fins; forming bottom spacers on the bottom source and drains; forming gates alongside the fins, wherein the gates formed alongside the at least one first fin have a first gate length Lg1, wherein the gates formed alongside the at least one second fin have a second gate length Lg2, and wherein Lg1<Lg2; forming top spacers over the gates at tops of the fins; and forming top source and drains over the top spacers.

In another aspect of the invention, a VFET device is provided. The VFET device includes: fins patterned in a first region and a second region of a wafer, wherein the fins include at least one first fin patterned to a first depth in the wafer and at least one second fin patterned to a second depth in the wafer, and wherein the second depth is greater than the first depth; bottom source and drains disposed at a base of the fins; bottom spacers disposed on the bottom source and drains; gates alongside the fins, wherein the gates formed alongside the at least one first fin have a first gate length Lg1, wherein the gates formed alongside the at least one second fin have a second gate length Lg2, and wherein Lg1<Lg2; top spacers over the gates at tops of the fins; and top source and drains over the top spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming different gate lengths in vertical field effect transistors (VFETs). Advantageously, the present techniques enable the formation of long channel input/output (I/O) and analog devices in the VFET architecture.

In a first exemplary embodiment of the present techniques, a method for forming a device having different gate length VFETs on the same wafer is provided. This first exemplary embodiment is now described by way of reference to FIGS. 1-34.

Figure 1:
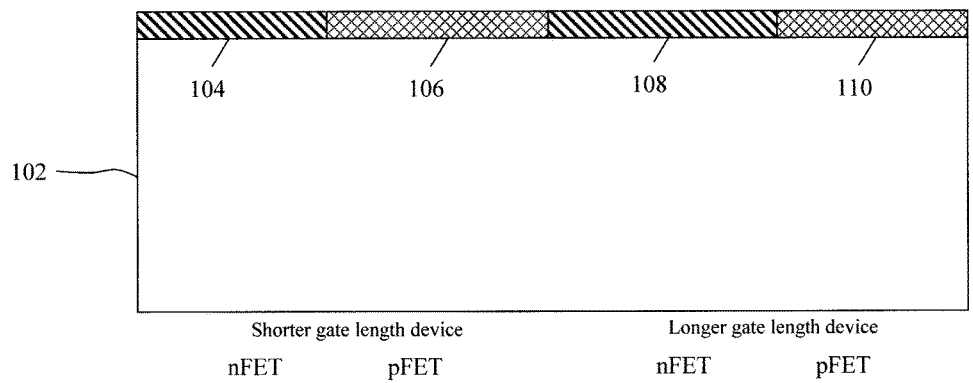
FIG. 1 is a cross-sectional diagram illustrating a starting structure for forming a vertical field effect transistor (VFET) device including a wafer having regions in which both nominal VFETs and extended gate (EGVFETs) will be formed and doped epitaxial layers having been grown on the wafer in both the nominal VFET and EGVFET regions according to an embodiment of the present invention.

As shown in FIG. 1, the process begins with a wafer 102. According to an exemplary embodiment, the wafer 102 is a bulk semiconductor wafer, such as a bulk silicon (Si), bulk germanium (Ge) and/or bulk silicon germanium (SiGe) wafer. Alternatively, wafer 102 can be a semiconductor-on-insulator (SOI) wafer. In general, a SOI wafer includes a SOI layer separated from an underlying substrate by a buried insulator. When the buried insulator is an oxide it is referred to as a buried oxide or BOX. The SOI layer can include any suitable semiconductor, such as Si, Ge and/or SiGe.

In the present example, two distinct regions of the wafer 102 are identified, one (a first region) in which n-channel FET (nFET) and p-channel (pFET) shorter gate length VFET devices will be formed (labeled "shorter gate length device") and another (a second region) in which nFET and pFET longer gate length VFET devices will be formed (labeled "longer gate length device"). The terms "shorter" and "longer" imply that the gate lengths of the devices are being evaluated relative to one another. Generally however, the shorter gate length devices are nominal VFETs (also referred to herein simply as VFETs) and the longer gate length devices are extended gate VFETs (also referred to herein simply as EGVFETs). Further, it is notable that while the figures depict the formation of one nFET and one pFET in each of the first (VFET)/second (EGVFET) regions, this is done merely for ease and clarity of depiction. It is to be understood that the present techniques can be implemented in the same manner described to produce more (or fewer) devices than shown.

As shown in FIG. 1, doped epitaxial layers 104, 106, 108, and 110 are grown on the wafer 102. As will become apparent from the description that follows, these epitaxial layers will serve as the basis for both the nFET and pFET top junctions. According to an exemplary embodiment, the epitaxial layers 104 and 108 are doped with an n-type dopant, and the epitaxial layers 106 and 110 are doped with a p-type dopant. Suitable epitaxial materials for epitaxial layers 104, 106, 108, and 110 include, but are not limited to, epitaxial Si, Ge and/or SiGe that is in-situ doped (i.e., during growth) or ex-situ doped (e.g., via a process such ion implantation) with an n-type or p-type dopant. Suitable n-type dopants include, but are not limited to, phosphorous (P) and/or arsenic (As), and suitable p-type dopants include, but are not limited to, boron (B).

Figure 2:
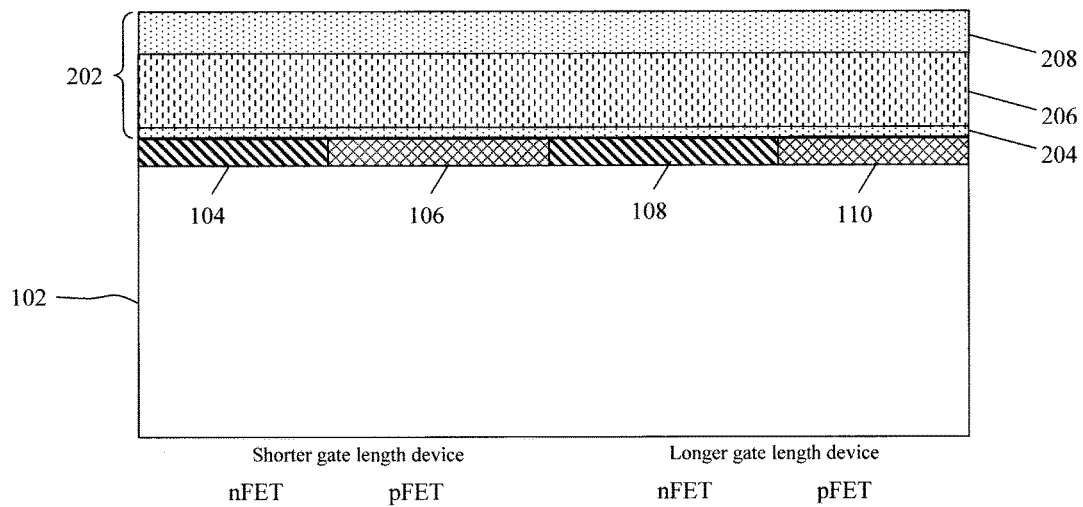
FIG. 2 is a cross-sectional diagram illustrating a hardmask stack having been formed on the wafer over the doped epitaxial layers according to an embodiment of the present invention.
Figure 3:
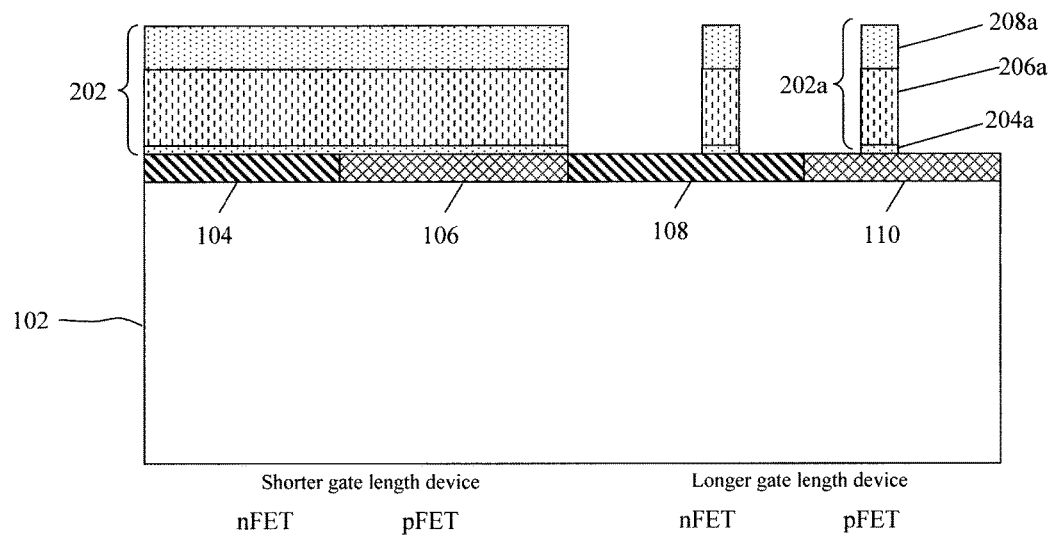
FIG. 3 is a cross-sectional diagram illustrating the hardmask stack having been patterned over the EGVFET region of the wafer to form a plurality of EGVFET fin hardmasks according to an embodiment of the present invention.

As shown in FIG. 2, a hardmask stack 202 is formed on the wafer 102, over the doped epitaxial layers 104, 106, 108, and 110. According to an exemplary embodiment, the hardmask stack 202 includes an oxide layer 204 disposed on the doped epitaxial layers 104, 106, 108, and 110, a nitride layer 206 disposed on the oxide layer 204, and an oxide layer 208 disposed on the nitride layer 206.

Standard lithography and etching techniques are then used to pattern the hardmask 202 over the second (longer gate length) region of the wafer 102 to form a plurality of (EGVFET) fin hardmasks 202a (wherein the constituent oxide layer 204/nitride layer 206/oxide layer 208 are now given reference numerals 204a, 206a, and 208a, respectively) that mark the footprint and location of at least one first (nFET) and at least one second (pFET) vertical fin channel in the second (EGVFET) region of the wafer 102. See FIG. 3.

Figure 4:
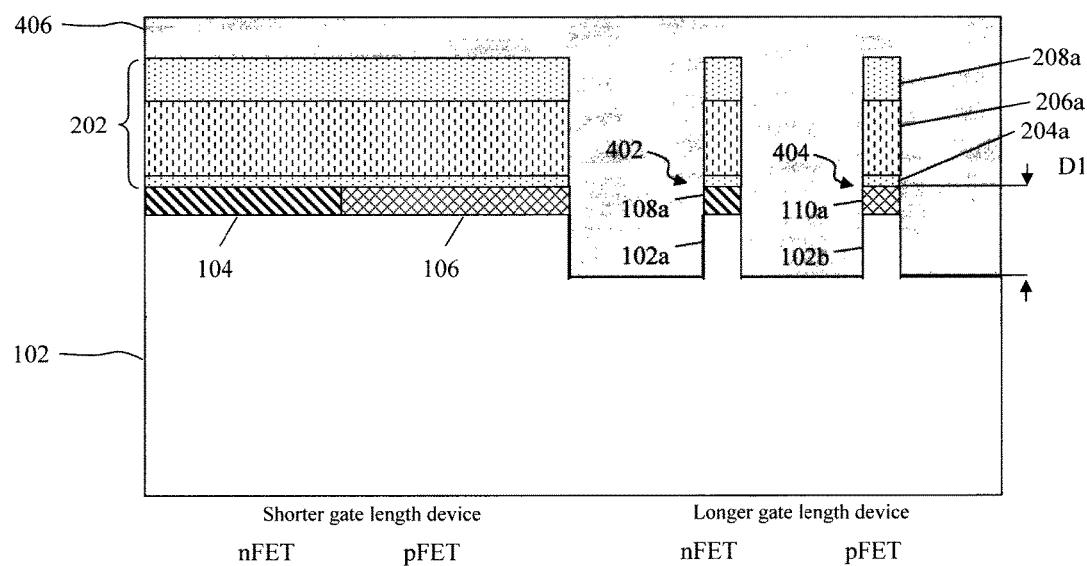
FIG. 4 is a cross-sectional diagram illustrating the EGVFET fin hardmasks having been used to partially pattern at least one first (nFET) fin and at least one second (pFET) fin in the EGVFET region of the wafer to a depth D1, and a (first) sacrificial material having been deposited onto the wafer over the n-FET according to an embodiment of the present invention.

The fin hardmasks 202a are then used to pattern at least one first (nFET) fin 402 and at least one second (pFET) fin 404 in the second (EGVFET) region of the wafer 102. See FIG. 4. As shown in FIG. 4, each fin 402 includes a patterned portion 108a of (n-type) doped epitaxial layer 108 and a portion 102a of wafer 102, and each fin 404 includes a patterned portion 110a of (p-type) doped epitaxial layer 110 and a portion 102b of wafer 102.

According to an exemplary embodiment, the fins 402 and 404 are patterned to a first depth D1. See FIG. 4. Suitable etching techniques include, but are not limited to an anisotropic etch such as reactive ion etching (RIE). As will become apparent from the description that follows, the depth D1 represents only a partial etch of the fins 402/404. Namely, a subsequent combined etch of fins 402/404 along with the fins in the first (nominal VFET) region will serve to extend the depth of fins 402/404 in the wafer 102 (i.e., to a second depth D2—see below).

In order to permit selective processing of the first (nominal VFET) region of the wafer 102, the fins 402/404 are then buried in a sacrificial layer 406. Suitable sacrificial materials for layer 406 include, but are not limited to, carbon and/or titanium nitride (TiN). Layer 406 is 'sacrificial' in the sense that it merely serves to temporarily mask-off the fins 402/404 to permit selective patterning of fin hardmasks in the in the first (nominal VFET) region of the wafer 102, after which the layer 406 is removed.

Figure 5:
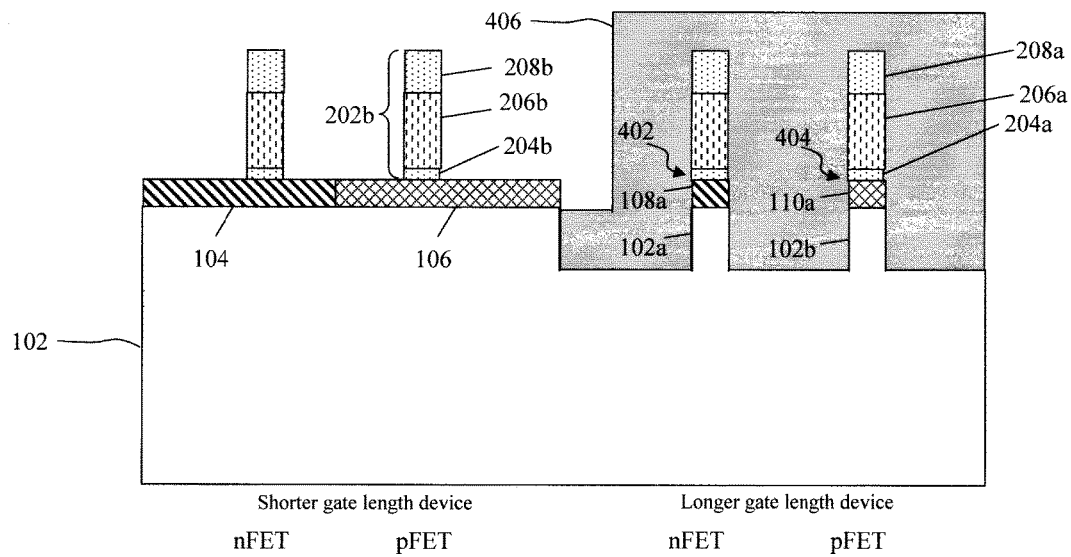
FIG. 5 is a cross-sectional diagram illustrating the (first) sacrificial material having been selectively removed from the nominal VFET region of the wafer, and the hardmask stack having been patterned over the nominal VFET region of the wafer to form a plurality of nominal VFET fin hardmasks according to an embodiment of the present invention.

Specifically, as shown in FIG. 5 the sacrificial layer 406 is selectively removed from the first (nominal VFET) region of the wafer 102. This enables patterning of the hardmask 202 over the first (nominal VFET) region of the wafer 102 to form a plurality of (nominal VFET) fin hardmasks 202b (wherein the constituent oxide layer 204/nitride layer 206/oxide layer 208 are now given reference numerals 204b, 206b, and 208b, respectively) that mark the footprint and location of at least one first (n-FET) and at least one second (p-FET) vertical fin channel in the first (nominal VFET) region of the wafer 102.

Figure 6:
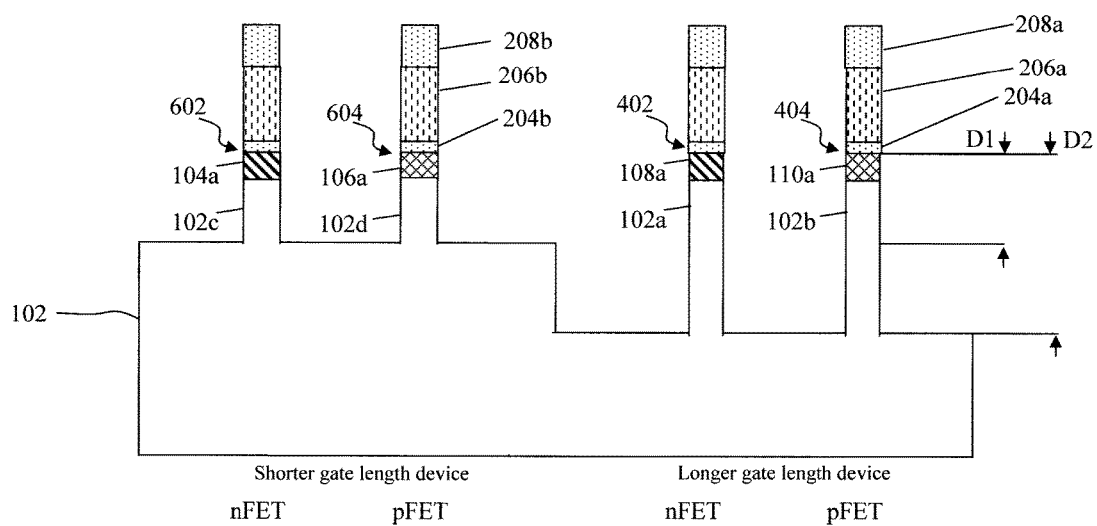
FIG. 6 is a cross-sectional diagram illustrating the nominal VFET fin hardmasks having been used to pattern at least one first (nFET) fin and at least one second (pFET) fin in the nominal VFET region of the wafer, and the nFET/pFET fins in the EGVFET region of the wafer having been extended to a depth D2>D1 according to an embodiment of the present invention.

At this point in the process, the remaining sacrificial layer 406 is removed. See FIG. 6. As shown in FIG. 6, the fin hardmasks 202b are then used to pattern at least one first (n-FET) fin 602 and at least one second (p-FET) fin 604 in the first (nominal VFET) region of the wafer 102. As shown in FIG. 6, each fin 602 includes a patterned portion 104a of (n-type) doped epitaxial layer 104 and a portion 102c of wafer 102, and each fin 604 includes a patterned portion 106a of (p-type) doped epitaxial layer 106 and a portion 102d of wafer 102.

In this exemplary embodiment, the fin etch is performed concurrently in the first (nominal VFET) and the second (EGVFET) regions of the wafer 102 to i) pattern the fins 602/604 in the first (nominal VFET) region of wafer 102 (e.g., to the depth D1) and ii) to extend the (partially etched) fins 402/404 in the second (EGVFET) region of the wafer 102 to a second depth D2. Thus, as a result of this second fin etch being performed currently in both (nominal VFET and EGVFET) regions, fins 602/604 are present at a depth D1 in the wafer 102 and fins 402/404 are present at a depth D2 in the wafer 102, wherein D2>D1.

Portions 102a/102b of fins 402/404 and portions 102c/102d of fins 602/604 will serve as the vertical fin channels of the respective nFET/pFET nominal VFET and EGVFET devices. The portions 108a/110a of fins 402/404 and portions 104a/106a of fins 602/604 will serve as the top source and drains of the respective nFET/pFET nominal VFET and EGVFET devices.

Figure 7:
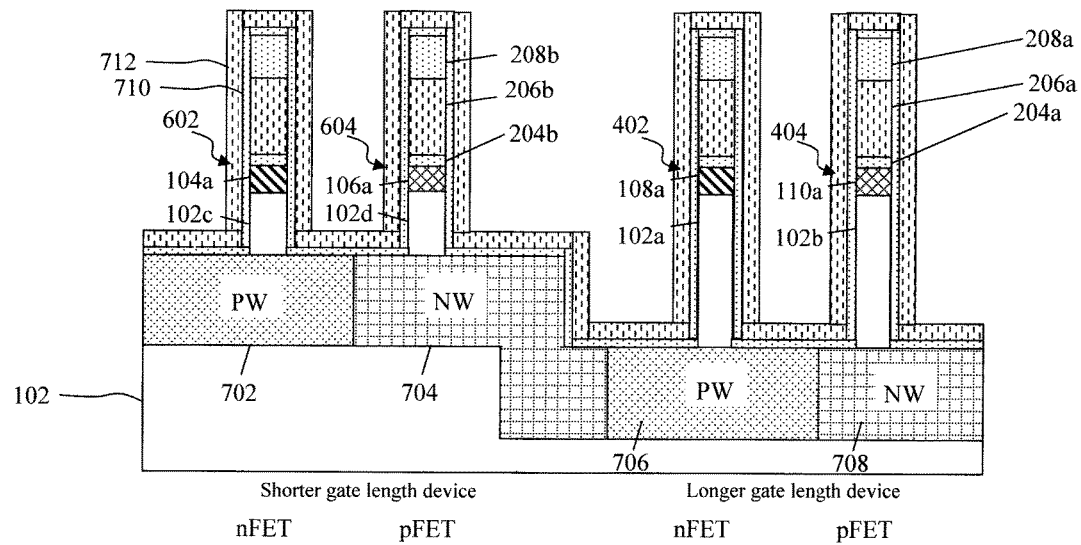
FIG. 7 is a cross-sectional diagram illustrating p-wells having been formed beneath the nFET fins and n-wells having been formed beneath the pFET fins in the nominal and EGVFET regions of the wafer, a conformal oxide layer having been deposited onto the nominal and EGVFET fins, and a conformal nitride layer having been deposited onto the oxide layer according to an embodiment of the present invention.

Ion implantation is then used to isolate the nFET and pFET devices in the nominal VFET and EGVFET regions from each other. See FIG. 7. As shown in FIG. 7, a p-type dopant is implanted into the wafer 102 beneath fins 402 and 602, and an n-type dopant is implanted into the wafer 102 beneath the fins 404 and 604, forming ion implantation regions, i.e., p-wells (PW) 702/706 and n-wells (NW) 704/708, respectively, beneath the corresponding fins. Suitable n-type and p-type dopants were provided above.

A conformal oxide layer 710 is then deposited over fins 402/404 and fins 602/604, and a conformal nitride layer 712 is deposited onto the conformal oxide layer 710. See FIG. 7. By way of example only, suitable oxide materials for layer 710 include, but are not limited to, silicon dioxide ($SiO_2$) and/or silicon carbon oxide (SiCO), and suitable nitride materials for layer 712 include, but are not limited to, silicon nitride (SiN), silicon boron carbon nitride (SiBCN), silicon oxycarbon nitride (SiOCN), and/or silicon carbon nitride (SiCN). In one exemplary embodiment, the conformal oxide layer 710 is used as a gate dielectric oxide for the long channel I/O device. By way of example only, the thickness of the conformal oxide layer 710 for use as a gate dielectric oxide is from about 2 nm to about 5 nm, and ranges therebetween. Preferred oxide materials for layer 710 as a gate dielectric oxide for the long channel I/O device include, but are not limited to, silicon dioxide ($SiO_2$) and/or nitrided silicon dioxide (SiON).

Figure 8:
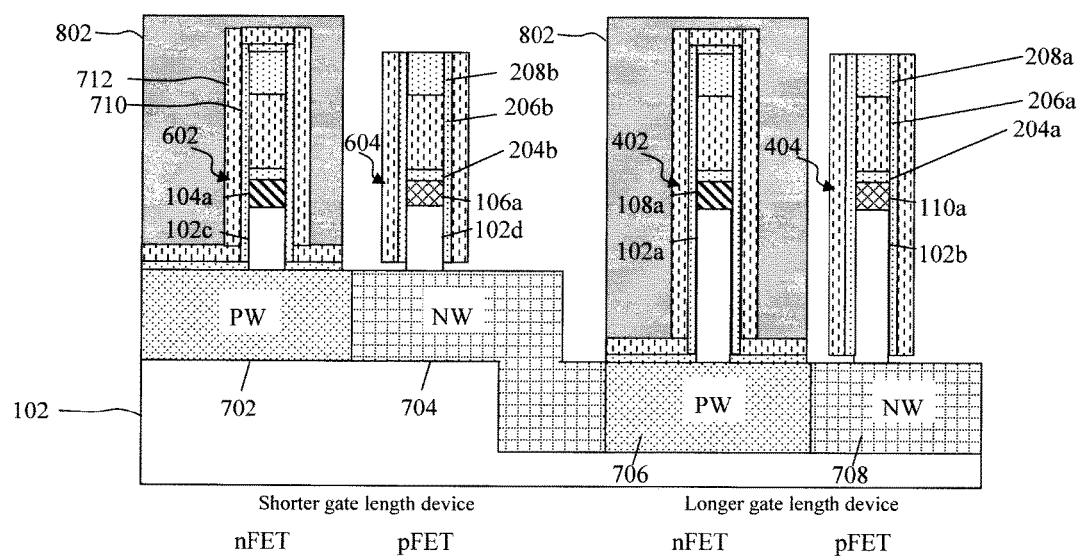
FIG. 8 is a cross-sectional diagram illustrating a (second) sacrificial layer having been used to selectively mask the nFET fins in the nominal and EGVFET regions of the wafer, and a directional etch having been used to remove the oxide and nitride layers from horizontal surfaces of the pFET fins in the nominal and EGVFET regions of the wafer according to an embodiment of the present invention.

A selective epitaxial growth process is then used to form bottom source and drains at the base of the fins. For instance, as shown in FIG. 8 a sacrificial layer 802 (e.g., carbon and/or TiN) is again used to first selectively mask the nFET fins in the nominal VFET and EGVFET regions. This permits opening of the pFETs for pFET bottom source and drain epitaxy. Namely, as shown in FIG. 8, a directional etch can be used to remove (unmasked) portions of the oxide layer 710 and nitride layer 712 from the horizontal surfaces of the pFET fins in the nominal VFET and EGVFET regions. In this example, the exposed horizontal surfaces are at the top of the wafer 102/base of the fins 404 and 604, and at the tops of the fins 404 and 604. See FIG. 8. The oxide layer 710 and nitride layer 712 however remain on the vertical surfaces, such as along the sidewalls of the fins 404 and 604, which will protect the fins 404 and 604 during the subsequent epitaxial process.

Figure 9:
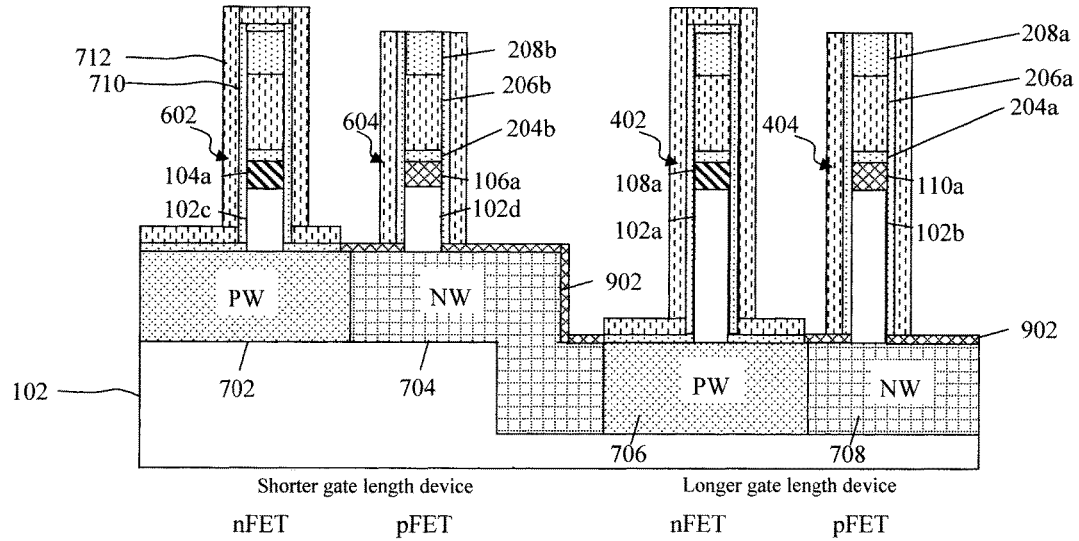
FIG. 9 is a cross-sectional diagram illustrating bottom source and drains having been formed at the base of the pFET fins in the nominal and EGVFET regions of the wafer, and the (second) sacrificial layer having been removed according to an embodiment of the present invention.
Figure 10:
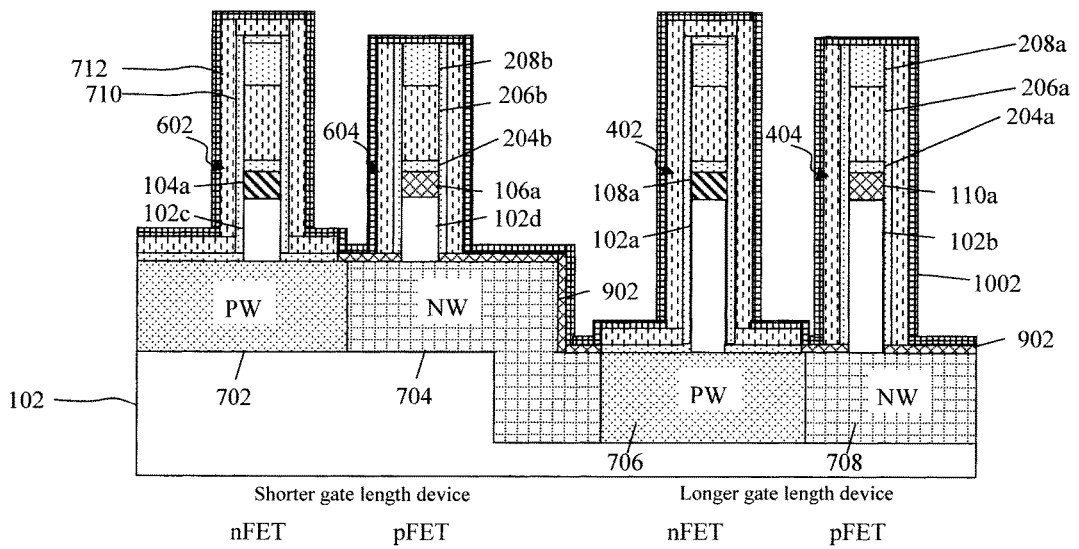
FIG. 10 is a cross-sectional diagram illustrating a nitride layer having been deposited onto the nFET/pFET fins in the nominal and EGVFET regions of the wafer according to an embodiment of the present invention.

Namely, as shown in FIG. 9 bottom source and drains 902 are formed on the top surface of the wafer 102 at the base of fins 404 and 604. According to an exemplary embodiment, bottom source and drains 902 are formed from epitaxial Si, Ge and/or SiGe that is in-situ doped (i.e., during growth) or ex-situ doped (e.g., via a process such as ion implantation) with an n-type dopant. Suitable n-type dopants were provided above. Following formation of the bottom source and drains 902, the sacrificial layer 802 is removed.

A nitride layer 1002 is then deposited onto the fins 402/404 and 602/604 covering the bottom source and drains 902. See FIG. 10. Suitable nitride materials for layer 1002 include, but are not limited to, SiN, SiBCN, SiOCN, and/or SiCN.

Figure 11:
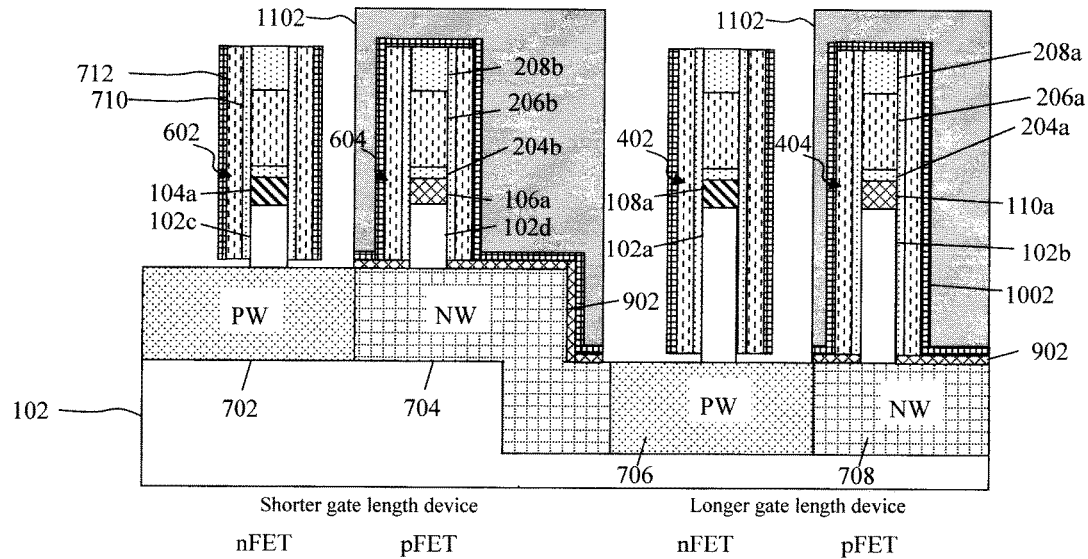
FIG. 11 is a cross-sectional diagram illustrating a (third) sacrificial layer having been used to selectively mask the pFET fins in the nominal and EGVFET regions of the wafer, and a directional etch having been used to remove the oxide and nitride layers from horizontal surfaces of the nFET fins in the nominal and EGVFET regions of the wafer according to an embodiment of the present invention.

Next, as shown in FIG. 11 a sacrificial layer 1102 (e.g., carbon and/or TiN) is used to then selectively mask the pFET devices in the nominal VFET and EGVFET regions. This permits opening of the nFETs for nFET bottom source and drain epitaxy. Namely, as shown in FIG. 11, a directional etch can be used to remove (unmasked) portions of the oxide layer 710 and nitride layer 712 from the horizontal surfaces of the nFET devices in the nominal VFET and EGVFET regions. In this example, the exposed horizontal surfaces are at the top of the wafer 102//base of the fins 402 and 602, and at the tops of the fins 402 and 602. See FIG. 11. The oxide layer 710 and nitride layer 712 however remain on the vertical surfaces, such as along the sidewalls of the fins 402 and 602, which will protect the fins 402 and 602 during the subsequent epitaxial process.

Figure 12:
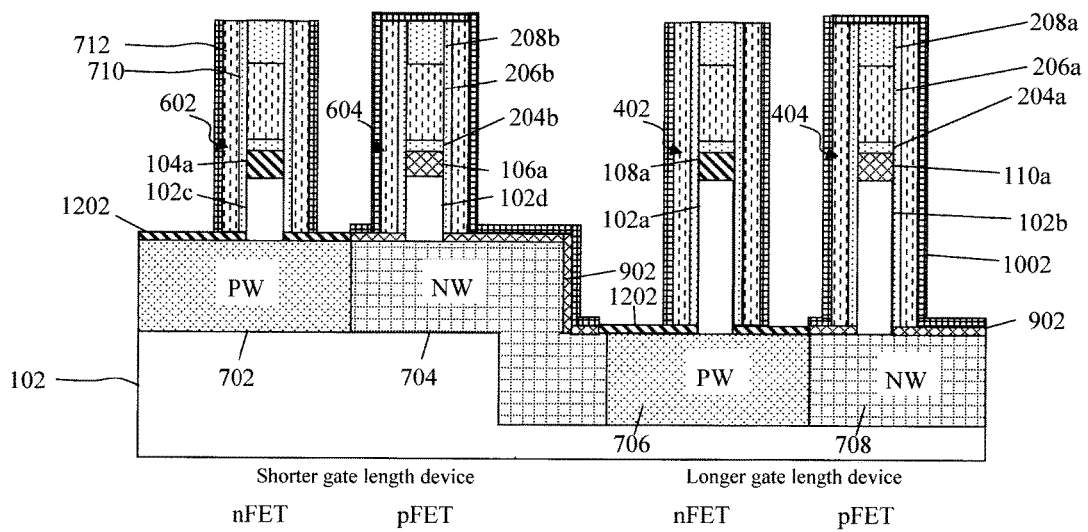
FIG. 12 is a cross-sectional diagram illustrating bottom source and drains having been formed at the base of the nFET fins in the nominal and EGVFET regions of the wafer, and the (third) sacrificial layer having been removed according to an embodiment of the present invention.

Namely, as shown in FIG. 12 bottom source and drains 1202 are formed on the wafer 102 at the base of fins 402 and 602. According to an exemplary embodiment, bottom source and drains 1202 are formed from epitaxial Si, Ge and/or SiGe that is in-situ doped (i.e., during growth) or ex-situ doped (e.g., via a process such ion implantation) with a p-type dopant. Suitable p-type dopants were provided above.

Following formation of the bottom source and drains 1202, the sacrificial layer 1102 is removed. Further, optionally, what remains of the nitride layers 712 and 1002 are removed at this stage. This will enable the formation of a conformal nitride layer 1302 that uniformly covers the fins 404/404 and 602/604. See FIG. 13. As above, suitable nitride materials for layer 1302 include, but are not limited to, SiN, SiBCN, SiOCN, and/or SiCN.

Figure 13:
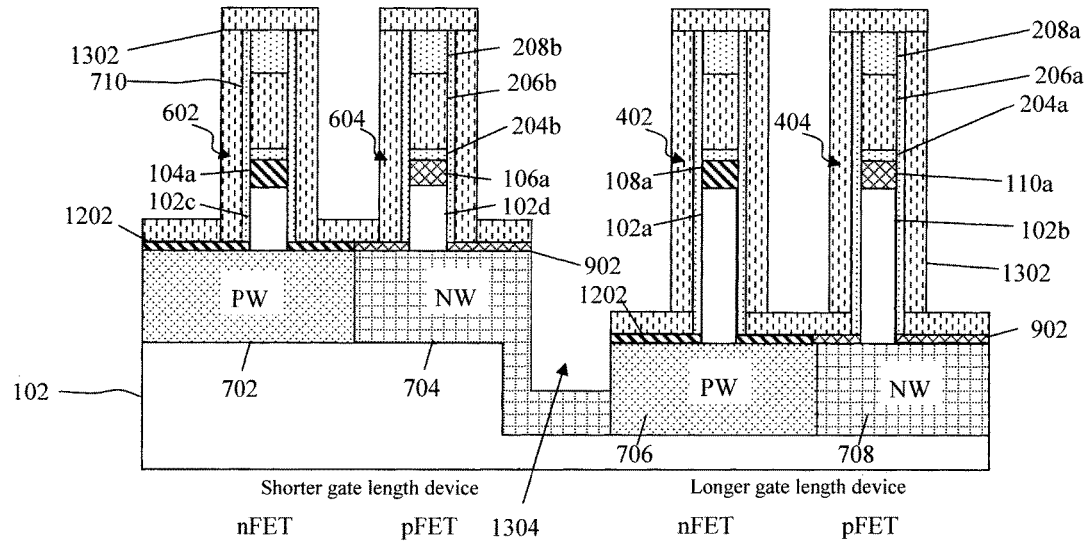
FIG. 13 is a cross-sectional diagram illustrating a trench having been formed between the nominal and EGVFET regions of the wafer according to an embodiment of the present invention.
Figure 14:
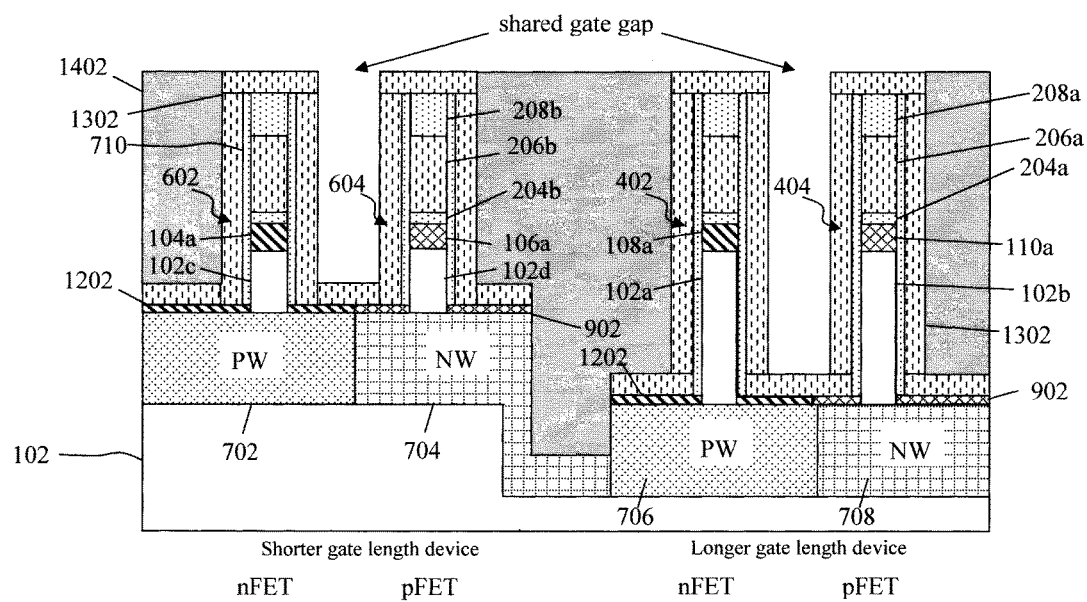
FIG. 14 is a cross-sectional diagram illustrating the nFET/pFET fins in the nominal and EGVFET regions of the wafer having been buried in a (fourth) sacrificial layer which is then selectively removed from a shared gate gap between the nFET/pFET fins in the nominal and EGVFET regions of the wafer according to an embodiment of the present invention.

As shown in FIG. 13, a trench 1304 is then formed between the nominal VFET and EGVFET regions of the wafer 102. This trench 1304 will be filled with a dielectric to provide an isolation region between the nominal VFET and EGVFET devices.

The fins 402/404 and 602/604 are then buried in a sacrificial layer 1402 (e.g., carbon and/or TiN). The sacrificial layer 1402 is then selectively removed from in between the nFET and pFET fins 602 and 604 in nominal VFET region, and from in between the nFET and pFET fins 402 and 404 in the EGVFET region. This (now) opened space in the sacrificial layer 1402 is between the fins of adjacent (nominal VFET or EGVFET) devices is also referred to herein as a shared gate gap. Opening the shared gate gap enables the formation of isolation regions between the nFET and pFET nominal VFET devices and between the nFET and pFET EGVFET devices.

Figure 15:
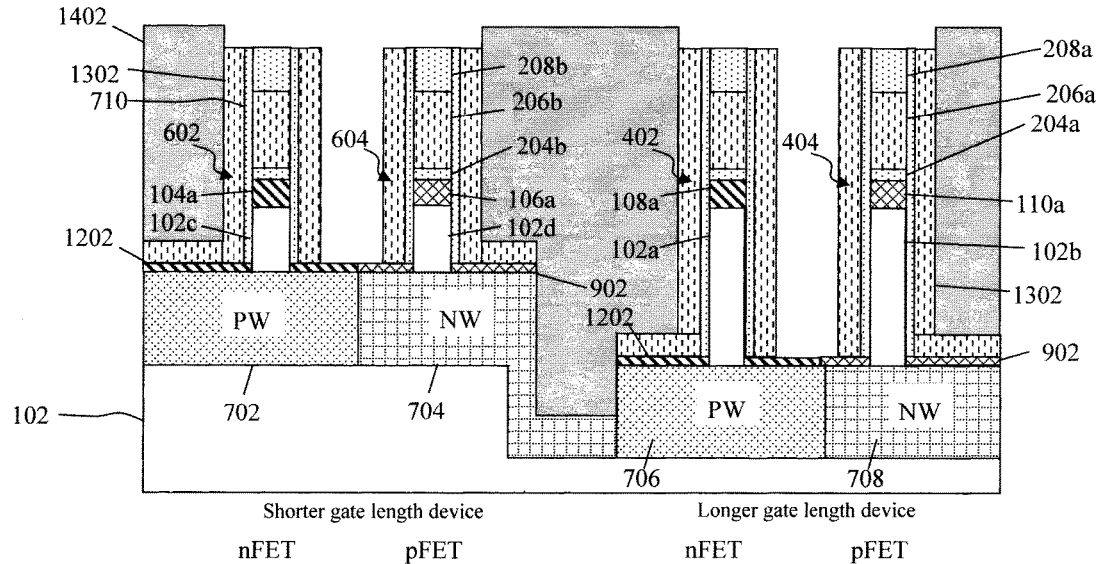
FIG. 15 is a cross-sectional diagram illustrating the nitride layer having been removed from the shared gate gap according to an embodiment of the present invention.

For instance, as shown in FIG. 15 the nitride layer 1302 is removed from the shared gate gap using, e.g., a nitride-selective RIE. The sacrificial layer 1402 isolates the RIE to the shared gate gap, however the nitride layer 1302 is exposed at the tops of the fins 404/404 and 602/604, and thus is also removed. See FIG. 15.

Figure 16:
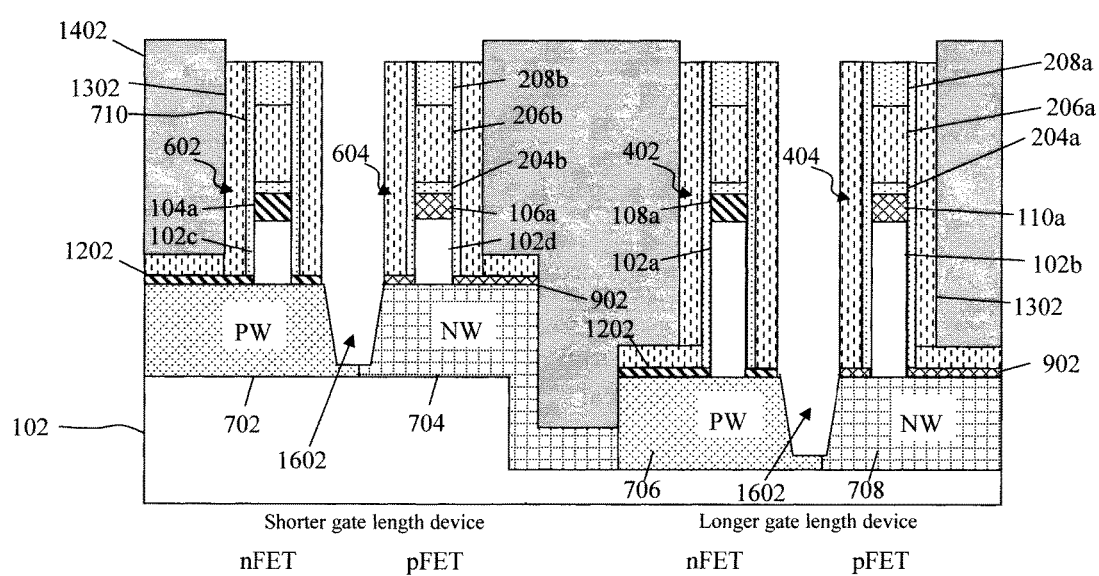
FIG. 16 is a cross-sectional diagram illustrating an etch through the shared gate gap having been used to form trenches in the wafer between the n-wells and p-wells in the nominal and EGVFET regions of the wafer, and the (fourth) sacrificial layer having been removed according to an embodiment of the present invention.
Figure 17:
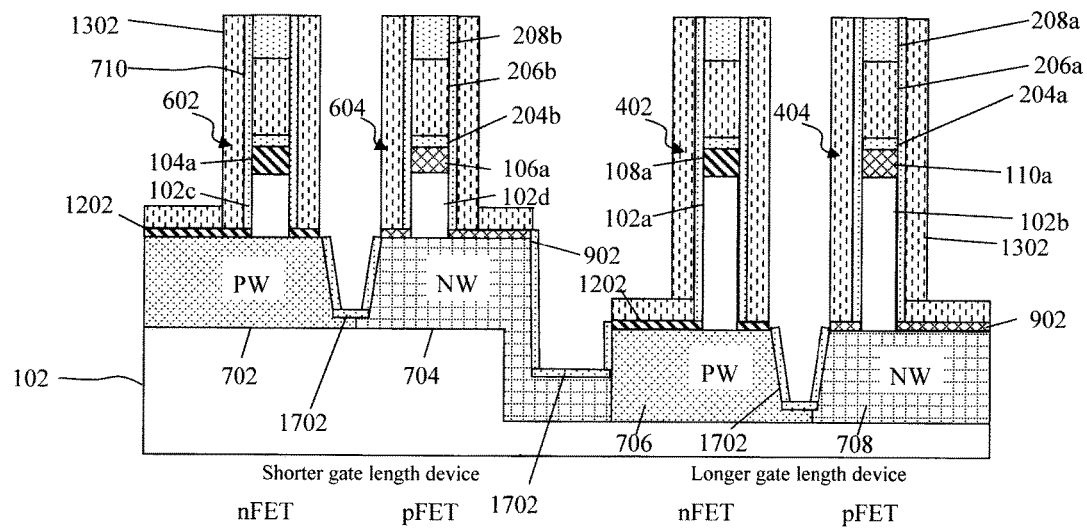
FIG. 17 is a cross-sectional diagram illustrating a thermal oxide having been formed lining the trenches thus forming isolation trenches, and the remaining nitride layer having been removed according to an embodiment of the present invention.

Removal of the nitride layer 1302 in the shared gate gap exposes the junction between the bottom source and drains 902 and 1202 at the base of the fins 402/404 and 602/604. An etch through the shared gate gap into the underlying wafer 102 is then used to form trenches 1602 between the PW 702 and NW 704, and between the PW 706 and NW 708. See FIG. 16. As shown in FIG. 16, the trenches 1602 extend through the bottom source and drains 902 and 1202, and into the PW/NW 702/704 and PW/NW 706/708. Following the trench etch, the remaining sacrificial layer 1402 is removed.

A thermal anneal is then performed to form a (thermal) oxide 1702 lining the trenches 1304 and 1602, forming isolation trenches. See FIG. 17. Optionally, what remains of the nitride layer 1302 is removed at this stage. This will enable the formation of a conformal nitride layer 1802 that uniformly covers the fins 404/404 and 602/604. See FIG. 18. As above, suitable nitride materials include, but are not limited to, SiN, SiBCN, SiOCN, and/or SiCN.

Figure 18:
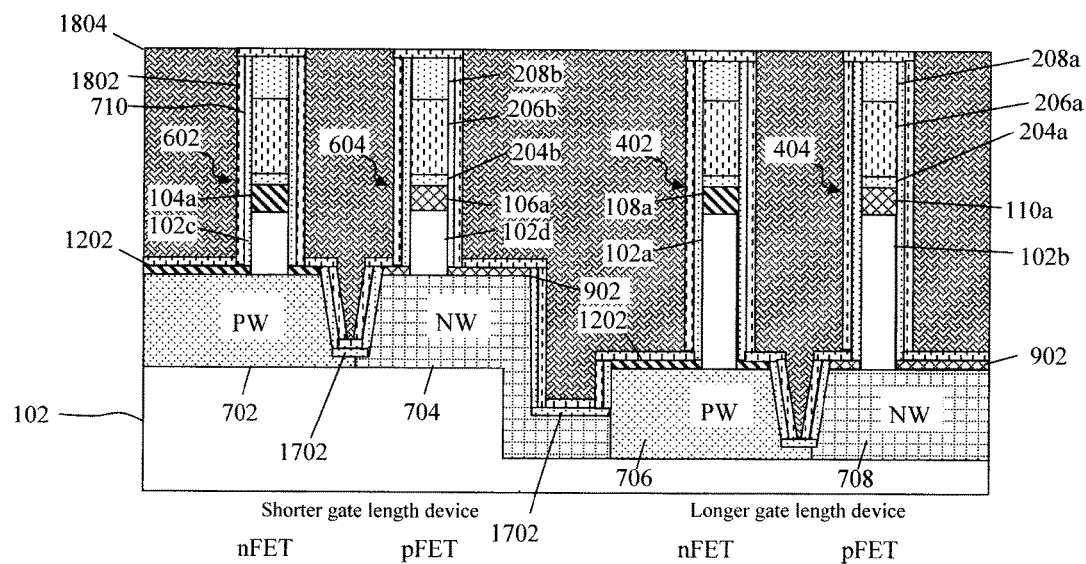
FIG. 18 is a cross-sectional diagram illustrating a conformal nitride layer having been formed on the nFET/pFET fins in the nominal and EGVFET regions of the wafer, and the nFET/pFET fins in the nominal and EGVFET regions of the wafer having been buried in a gap fill dielectric according to an embodiment of the present invention.

The fins 404/404 and 602/604 are then buried in a gap fill dielectric 1804. According to an exemplary embodiment, the gap fill dielectric 1804 is an oxide material such as $SiO_2$ and/or SiCO. Ultimately, the goal will be to have the gap fill dielectric 1804 remain in the isolation trenches 1304 and 1602. Thus, as shown in FIG. 18, the gap fill dielectric 1804 is first polished down to the nitride layer 1802 at the tops of the fins 404/404 and 602/604, e.g., using a process such as chemical-mechanical polishing (CMP).

Figure 19:
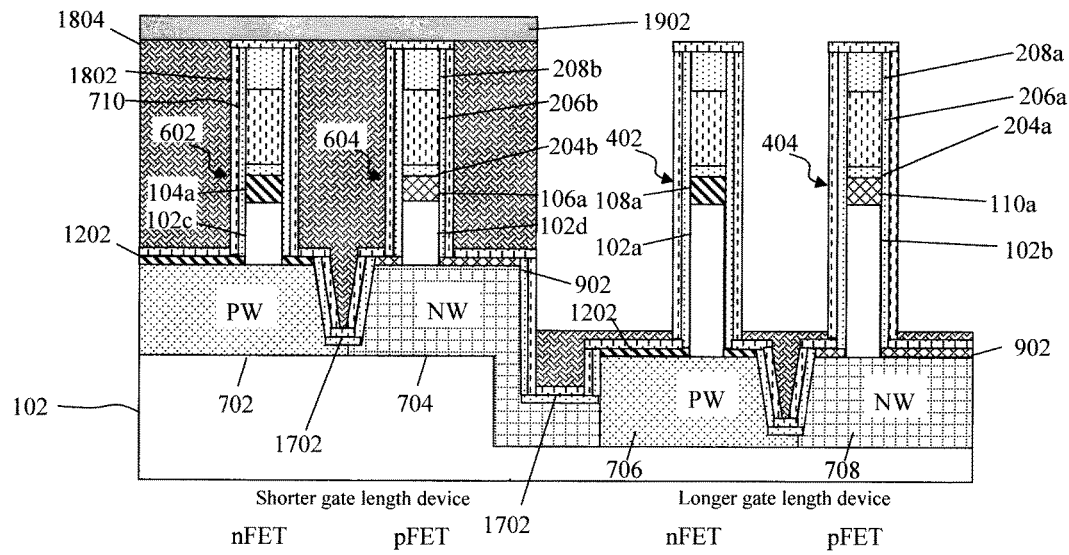
FIG. 19 is a cross-sectional diagram illustrating the gap fill dielectric having been selectively recessed in the EGVFET region of the wafer but remaining in the isolation trenches according to an embodiment of the present invention.

Next, the gap fill dielectric 1804 is recessed in the EGVFET region of the wafer 102. See FIG. 19. To do so, a patterned hardmask 1902 is formed on/masking the gap fill dielectric 1804 in the VFET region of the wafer 102, and a recess etch is used to recess the gap fill dielectric 1804. As shown in FIG. 19, the recessed gap fill dielectric 1804 remains filling the isolation trench 1304 and the isolation trench 1602 in the EGVFET region of the wafer 102. The recess etch does not need to extend down precisely to the tops of the isolation trenches 1304/1602 and, in fact, it is preferable to have a portion of the gap fill dielectric 1804 overfilling the isolation trenches 1304/1602 (any excess gap fill dielectric 1804 will be removed during a subsequent oxide strip). This excess fill dielectric 1804 will cover the nitride layer 1802, permitting selective formation of (nitride) bottom spacers (see below). Following the recess etch, the patterned hardmask 1902 is removed.

The reason that separate recess etches of the gap fill dielectric 1804 are needed to create the isolation trenches is that the EGVFET and nominal VFET regions are at different depths in the wafer 102. Thus, a single recess etch to form the isolation trenches in the deeper region (the EGVFET region) would completely clear the gap fill dielectric 1804 from the isolation trenches in the shallower (nominal VFET) region. Hence, a two-step recess etch is needed to set the isolation trenches at the proper depth for each region.

Figure 20:
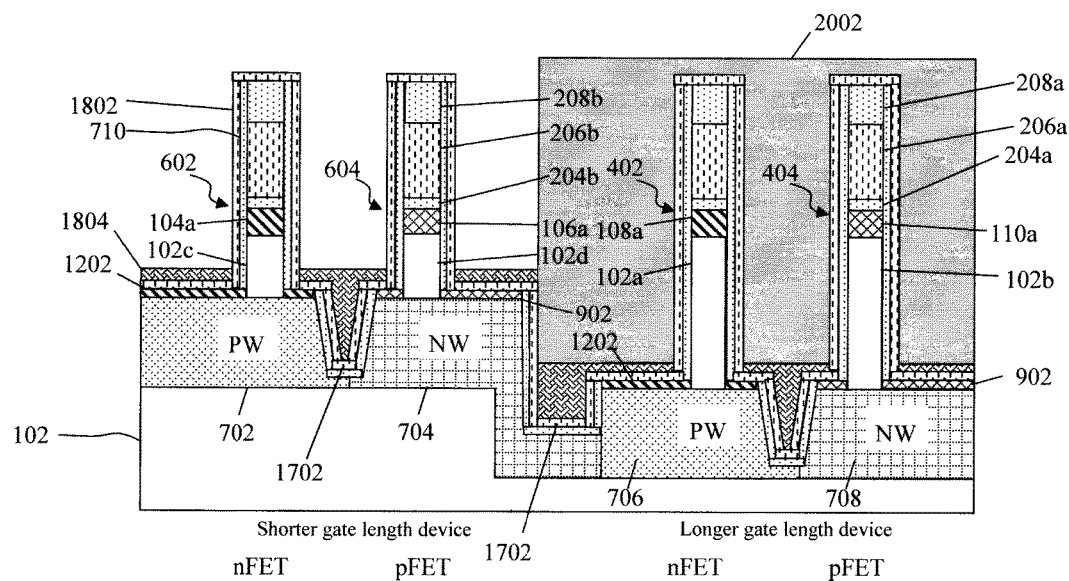
FIG. 20 is a cross-sectional diagram illustrating the recessed gap fill dielectric in the EGVFET region of the wafer having been masked using a (fifth) sacrificial layer, and the gap fill dielectric having been selectively recessed in the nominal VFET region of the wafer but remaining in the isolation trenches according to an embodiment of the present invention.

Namely, as shown in FIG. 20 the recessed gap fill dielectric 1804 in the EGVFET region is covered by a sacrificial layer 2002 (e.g., carbon and/or TiN), and a recess etch is used to recess the gap fill dielectric 1804 in the nominal VFET region. As shown in FIG. 20, the recessed gap fill dielectric 1804 remains filling the isolation trench 1304 and the isolation trench 1602 in the nominal VFET region of the wafer 102. As above, the recess etch does not need to extend down precisely to the tops of the isolation trenches 1304/1602 and, in fact, it is preferable to have a portion of the gap fill dielectric 1804 overfilling the isolation trenches 1304/1602 (any excess gap fill dielectric 1804 will be removed during a subsequent oxide strip). This excess fill dielectric 1804 will cover the nitride layer 1802, permitting selective formation of (nitride) bottom spacers over the bottom source and drains (see below).

Figure 21:
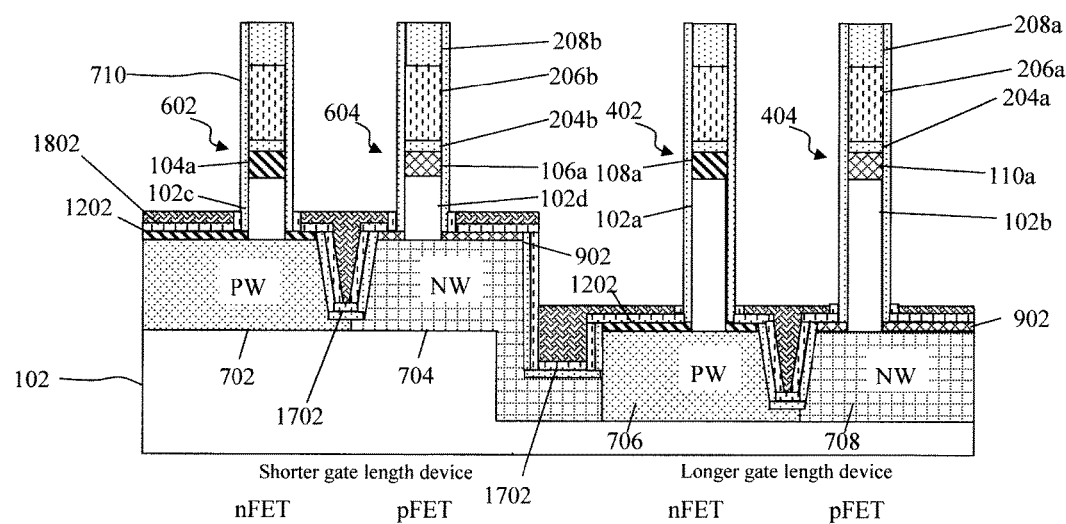
FIG. 21 is a cross-sectional diagram illustrating the (fifth) sacrificial layer having been removed according to an embodiment of the present invention.

Following the recess etch of the gap fill dielectric 1804, the sacrificial layer 2002 is removed. See FIG. 21. As shown in FIG. 21, what remains after the (two-step) recess etch of gap fill dielectric 1804 is isolation trenches 1304/1602 (see FIGS. 13 and 16) in the nominal VFET and EGVFET regions filled with the gap fill dielectric 1804.

Figure 22:
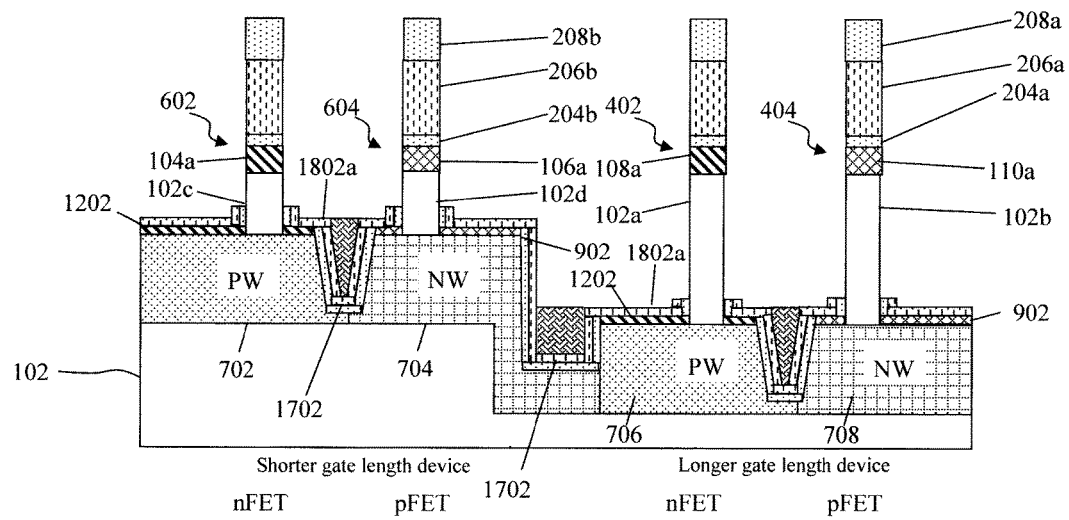
FIG. 22 is a cross-sectional diagram illustrating the conformal nitride layer having been removed except for portions thereof forming bottom spacers on the bottom source and drains according to an embodiment of the present invention.

As shown in FIG. 22, the exposed nitride layer 1802 is removed (e.g., via a nitride-selective etch). Advantageously, since portions of the nitride layer 1802 at the bottom/base of the fins 402/404 and 602/604 is covered by the gap fill dielectric 1804 overfill from the isolation trenches 1304/

1602, these portions of the nitride layer 1802 will remain as bottom (nitride) spacers—now given reference numeral 1802a. Following removal of the nitride layer 1802, the oxide layer 710 is also removed. See FIG. 22.

Figure 23:
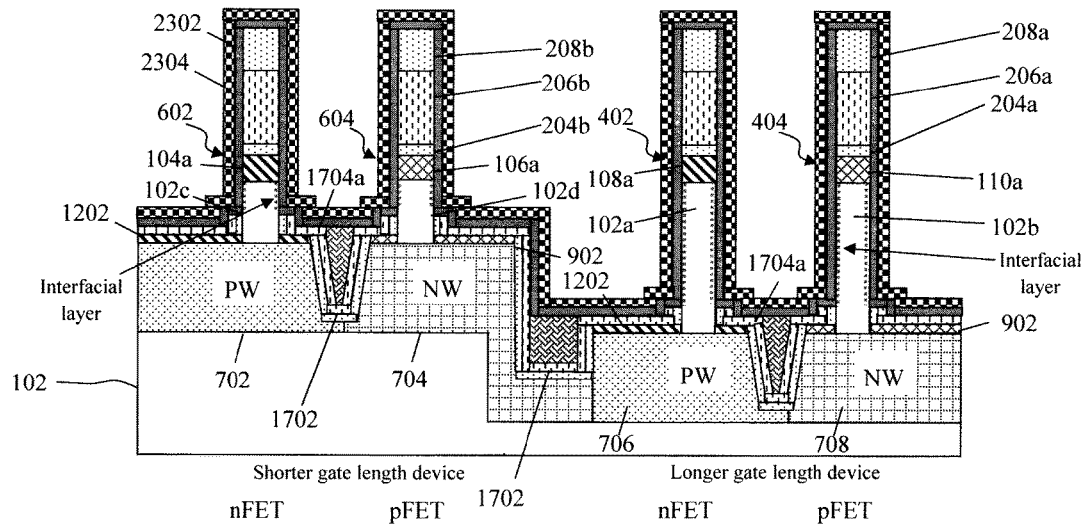
FIG. 23 is a cross-sectional diagram illustrating a conformal gate dielectric having been deposited onto the nFET/pFET fins in the nominal and EGVFET regions of the wafer, and a conformal gate conductor having been deposited onto the gate dielectric forming gates over the nFET/pFET fins in the nominal and EGVFET regions of the wafer according to an embodiment of the present invention.

Gates (i.e., a high-κ gate dielectric and a gate conductor) are then formed alongside the fins 402/404 and 602/604. See FIG. 23. As shown in FIG. 23, an interfacial layer is formed on the fins 402/404 and 602/604 before the high-κ gate dielectric. By way of example only, the interfacial layer can be $SiO_2$ or SiON with a thickness from about 0.5 nm to about 1.5 nm, and ranges therebetween. Next, as shown in FIG. 23 a conformal gate dielectric 2302 is deposited on the fins 402/404 and 602/604 (over the interfacial layer), and a conformal gate conductor 2304 is deposited onto the gate dielectric 2302. In one exemplary embodiment, the conformal gate conductor 2304 is a workfunction-setting metal, and the conformal gate dielectric 2302 is a high-κ gate dielectric.

The particular workfunction-setting metal employed can vary depending on whether an n-type or p-type transistor is desired. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for silicon dioxide). Suitable high-κ gate dielectrics include, but are not limited to, $HfO_2$ and/or lanthanum oxide ($La_2O_3$).

Figure 24:
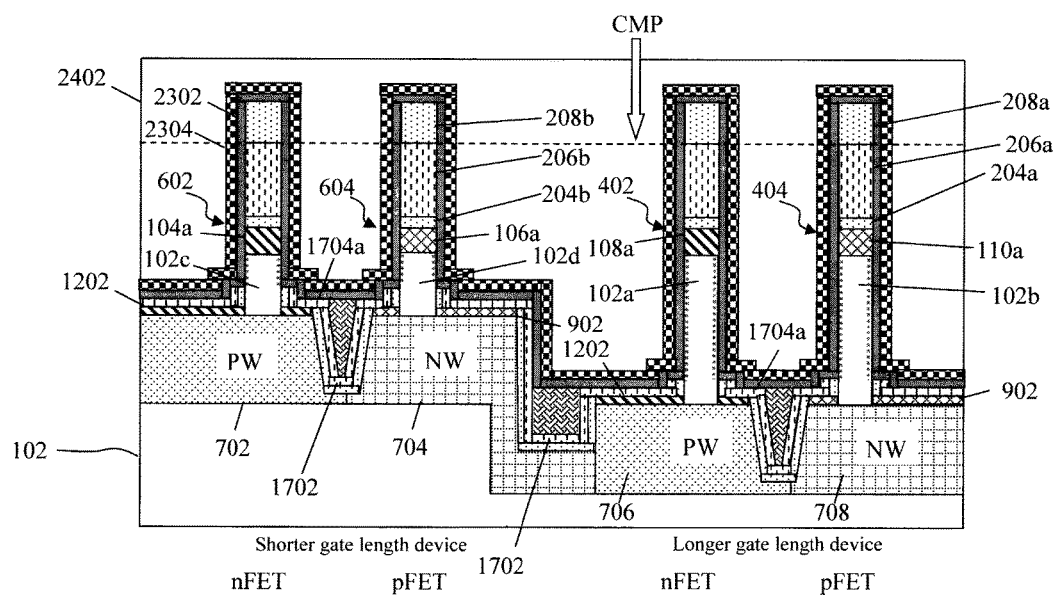
FIG. 24 is a cross-sectional diagram illustrating the nFET/pFET fins and gates in the nominal and EGVFET regions of the wafer having been buried in a (first) gap fill dielectric according to an embodiment of the present invention.

The gate dielectric 2302 and gate conductor 2304 need to be recessed in order to access the tops of the fins 402/404 and 602/604. To do so, the fins 402/404 and 602/604 and gates are first buried in a gap fill dielectric 2402. See FIG. 24. According to an exemplary embodiment, after deposition the gap fill-dielectric 2402 is then polished down to the nitride layer 206a,b of the fin hardmasks using a process such as chemical-mechanical polishing (CMP). See dotted line in FIG. 24 showing the top of the gap fill-dielectric 2402 after CMP.

Figure 25:
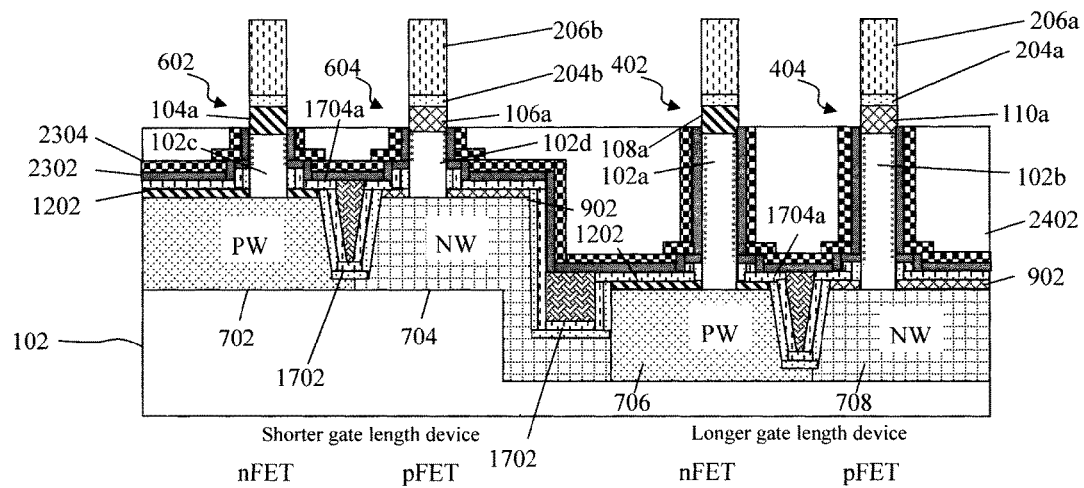
FIG. 25 is a cross-sectional diagram illustrating the gap fill dielectric having been recessed, and the gates having been recessed to the level of the (recessed) gap fill dielectric according to an embodiment of the present invention.
Figure 26:
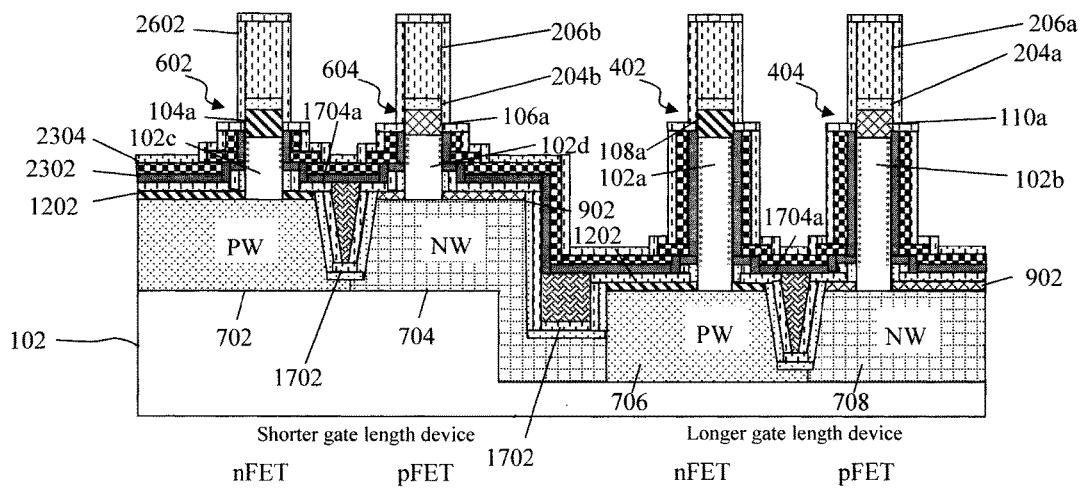
FIG. 26 is a cross-sectional diagram illustrating the recessed gap fill dielectric having been removed, and a conformal encapsulation layer having been deposited onto the nFET/pFET fins and recessed gates in the nominal and EGVFET regions of the wafer according to an embodiment of the present invention.
Figure 27:
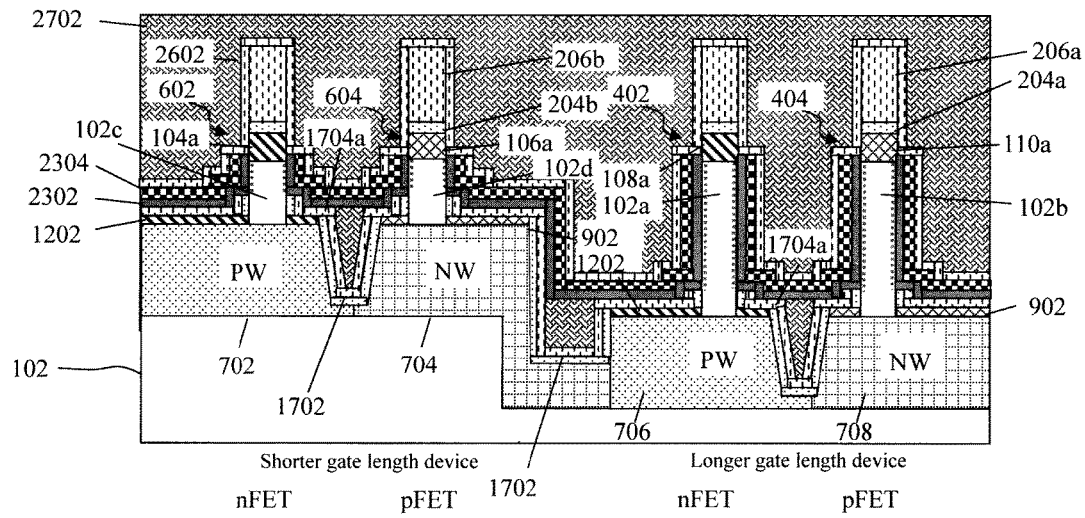
FIG. 27 is a cross-sectional diagram illustrating the nFET/pFET fins and recessed gates in the nominal and EGVFET regions of the wafer having been buried in a (second) gap fill dielectric according to an embodiment of the present invention.

The gap fill dielectric 2402 is then recessed. See FIG. 25. The recessed gap fill dielectric 2402 sets the height of the gates. Namely, as shown in FIG. 25 the gate dielectric 2302 and the gate conductor 2304 are next recessed to the level of the (recessed) gap fill dielectric 2402.

Following the gate dielectric 2302/gate conductor 2304 recess, the remaining gap fill dielectric 2402 is removed and a conformal encapsulation layer 2602 is deposited onto the fins 402/404 and 602/604 and the gates. See FIG. 26. Suitable materials for the encapsulation layer 2602 include, but are not limited to, nitride materials such as SiN, SiBCN, SiOCN, and/or SiCN. The encapsulation layer 2602 will provide top spacers over the gates (and separating the gates from the top source and drains) see below.

The fins 402/404 and 602/604 above the recessed gates are then buried in a gap fill dielectric 2702. See FIG. 27. Placement of the gap fill dielectric permits selective exposure of the tops of the fins 402/404 and 602/604 for further processing.

Figure 28:
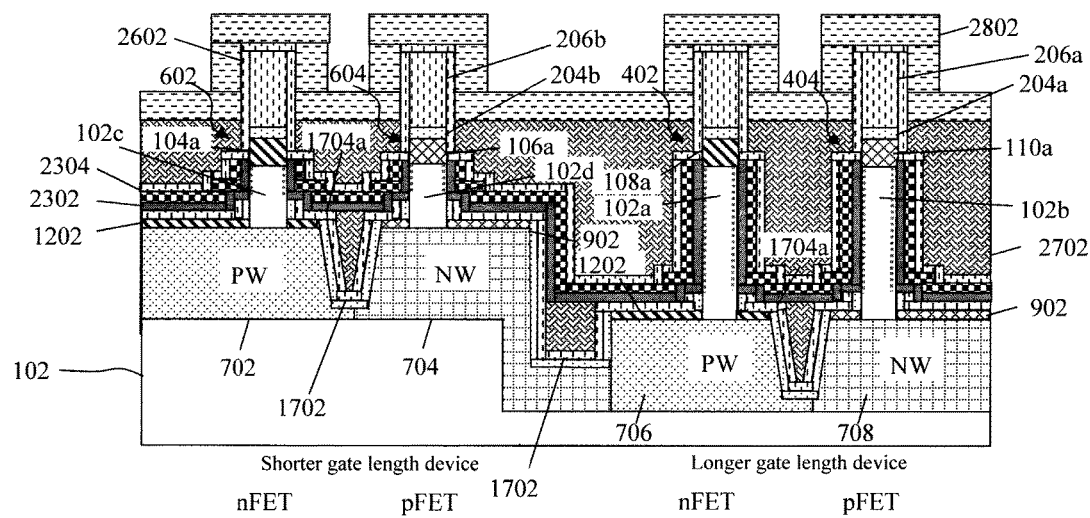
FIG. 28 is a cross-sectional diagram illustrating the (second) gap fill dielectric having been recessed exposing the tops of the nFET/pFET fins in the nominal and EGVFET regions of the wafer, and a spacer layer having been formed over the tops of the nFET/pFET fins in the nominal and EGVFET regions of the wafer according to an embodiment of the present invention.

Namely, as shown in FIG. 28 the gap fill dielectric 2702 is recessed (exposing the tops of the fins 402/404 and 602/604), and a spacer layer 2802 is formed on the (recessed) gap fill dielectric 2702 over the tops of the fins 402/404 and 602/604. Suitable materials for the spacer layer 2802 include, but are not limited to, nitride materials such as SiN, SiBCN, SiOCN, and/or SiCN.

Figure 29:
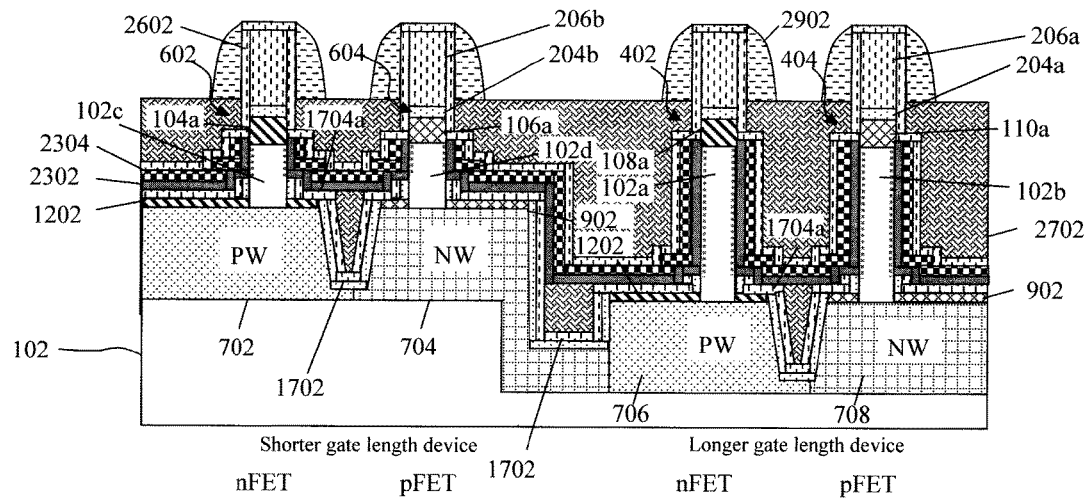
FIG. 29 is a cross-sectional diagram illustrating the spacer layer having been patterned to form individual spacers on opposite sides of the tops of the nFET/pFET fins in the nominal and EGVFET regions of the wafer according to an embodiment of the present invention.
Figure 30:
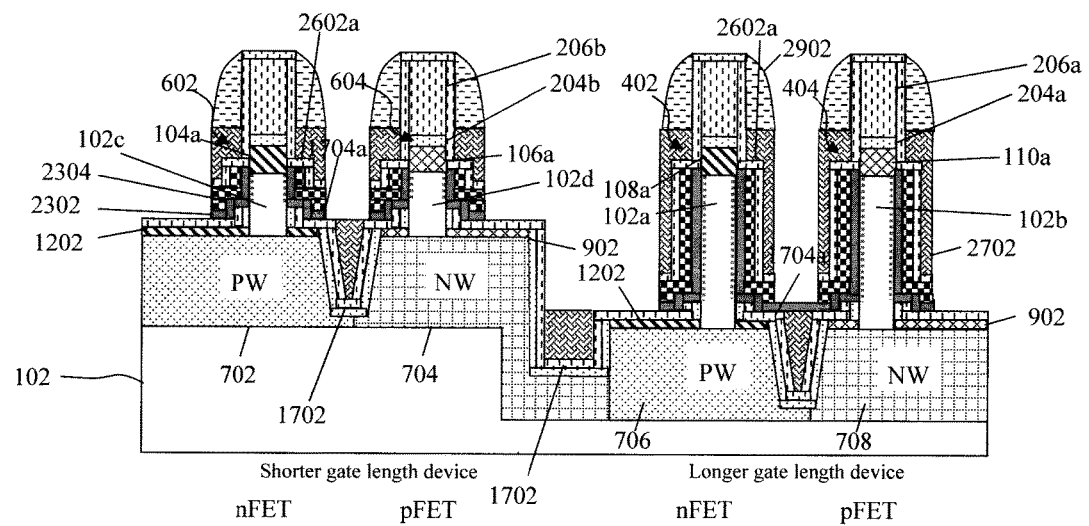
FIG. 30 is a cross-sectional diagram illustrating an etch having been performed in between the spacers and down through the gate dielectric and gate conductor to isolate the nFET/pFET fins in the nominal and EGVFET regions of the wafer devices from one another according to an embodiment of the present invention.
Figure 31:
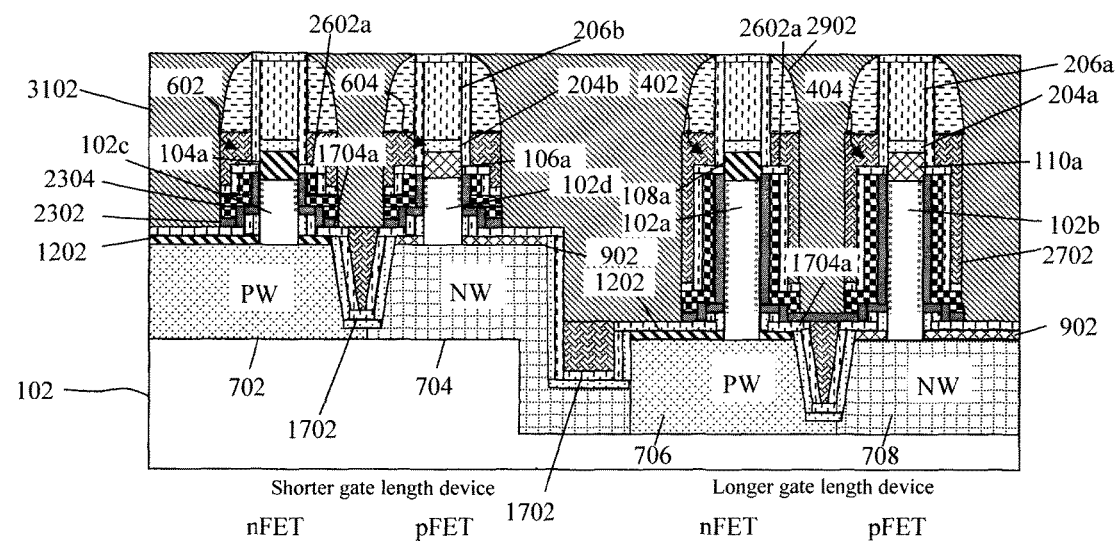
FIG. 31 is a cross-sectional diagram illustrating the nFET/pFET fins in the nominal and EGVFET regions of the wafer having been buried in a (third) gap fill dielectric according to an embodiment of the present invention.

The gates remain interconnected at the base of the fins 402/404 and 602/604. In order to form isolated devices, these interconnections need to be cut. For instance, as shown in FIG. 29 the spacer layer 2802 is then patterned to form individual spacers 2902 on opposite sides of the tops of the fins 402/404 and 602/604. As shown in FIG. 30, an etch in between the spacers 2902 and down through the gap fill dielectric 2702 and the gate dielectric 2302/gate conductor 2304 isolates the devices from one another.

As provided above, the encapsulation layer 2602 provides top spacers over the gates (and separating the gates from the top source and drains). Following the etch to isolate the devices, these top spacers are given the reference numeral 2602a. See FIG. 30.

The devices are then buried in a gap fill dielectric 3102. See FIG. 31. A process such as CMP is used to polish the gap fill dielectric 3102 down to the encapsulation layer 2602 at the tops of the fins 402/404 and 602/604. The gap fill dielectric 3102 will permit the tops of the fins 402/404 and 602/604 to be selectively exposed for top source and drain formation.

Figure 32:
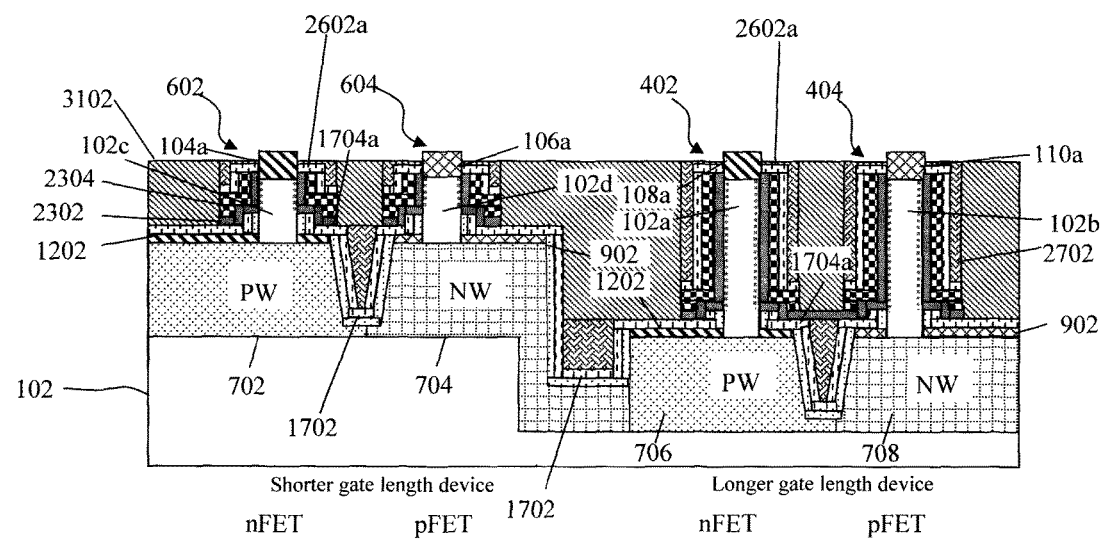
FIG. 32 is a cross-sectional diagram illustrating the (third) gap fill dielectric having been recessed below the tops of the nFET/pFET fins in the nominal and EGVFET regions of the wafer, and the spacers and nominal and EGVFET fin hardmasks having been removed exposing the top source and drains according to an embodiment of the present invention.

For instance, as shown in FIG. 32 the gap fill dielectric 3102 has been recessed below the tops of the fins 402/404 and 602/604, and the spacers 2902 and fin hardmask (i.e., oxide layer 204a/b, nitride layer 206a/b and oxide layer 208a/b) having been removed, exposing the (top source and drains) portions 108a/110a and portions 104a/106a at the tops of the fins 402/404 and 602/604, respectively.

A doped epitaxial material 3308a/3310a and 3304a/3306a is then grown on the exposed portions 108a/110a and portions 104a/106a (i.e., the top source and drains) at the tops of the fins 402/404 and 602/604, respectively. See FIG. 33. According to an exemplary embodiment, doped epitaxial material 3306a and 3310a are formed from epitaxial Si, Ge and/or SiGe that is in-situ doped (i.e., during growth) or ex-situ doped (e.g., via a process such as ion implantation) with an n-type dopant. Suitable n-type dopants were provided above. Doped epitaxial material 3304a and 3308a are formed from epitaxial Si, Ge and/or SiGe that is in-situ doped (i.e., during growth) or ex-situ doped (e.g., via a process such as ion implantation) with a p-type dopant. Suitable p-type dopants were provided above.

Figure 33:
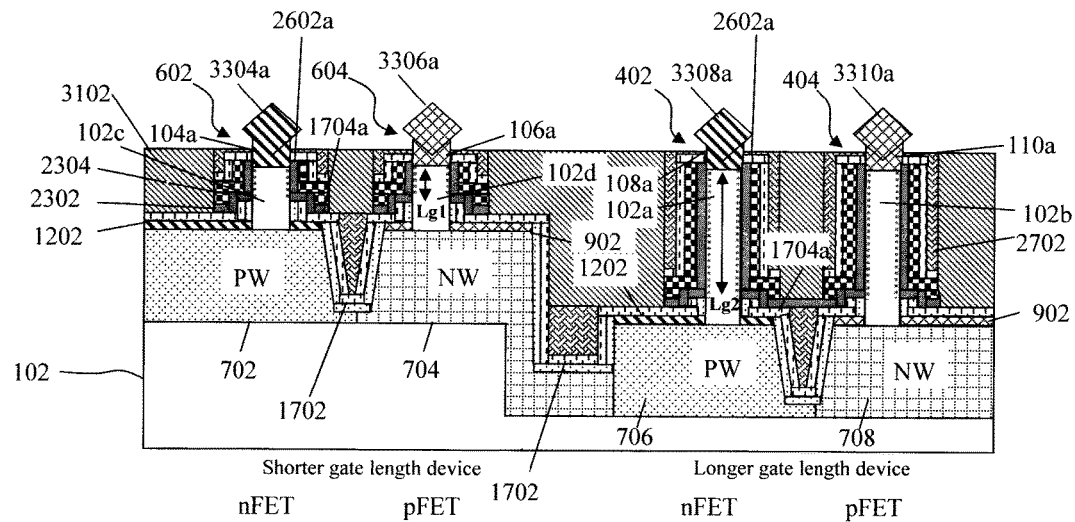
FIG. 33 is a cross-sectional diagram illustrating a doped epitaxial material having been grown on the exposed top source and drains thus forming nFET/pFET devices in the nominal and EGVFET regions of the wafer according to an embodiment of the present invention.
Figure 34:
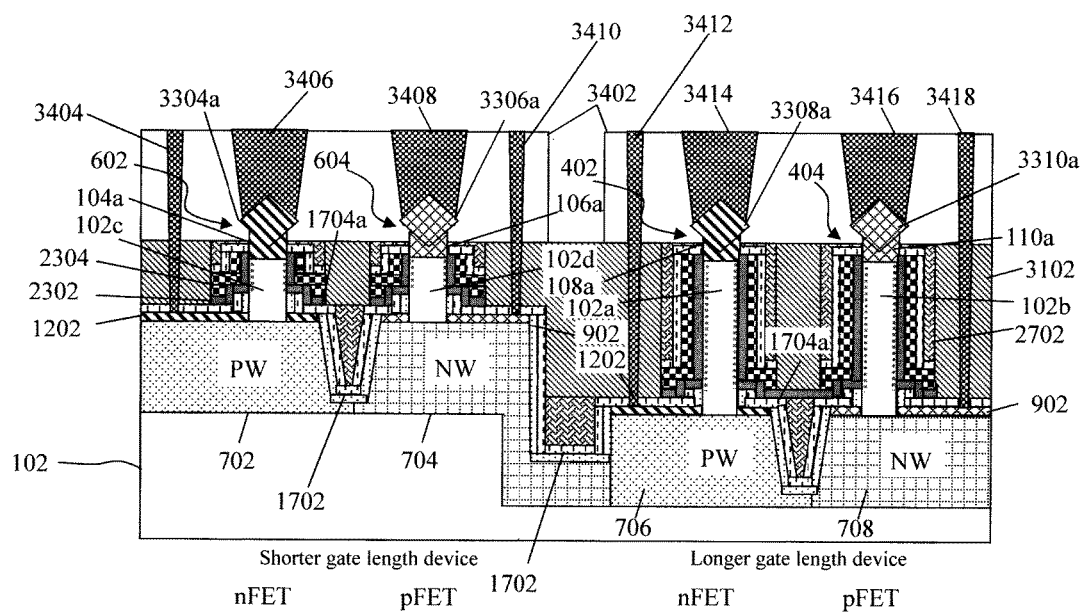
FIG. 34 is a cross-sectional diagram illustrating the nFET/pFET devices in the nominal and EGVFET regions of the wafer having been buried in an interlayer dielectric (ILD), and contacts having been formed in the ILD to the top and bottom source and drains of the nFET/pFET devices in the nominal and EGVFET regions of the wafer according to an embodiment of the present invention.

Based on the present process the nFET/pFET nominal VFETs are produced having a same first gate length Lg1 and the nFET/pFET EGVFETs are produced having a same second gate length Lg2. See FIG. 33. As shown in FIG. 33, Lg1<Lg2. Advantageously, both of these nominal VFET and EGVFET devices have been produced on the same wafer. According to an exemplary embodiment, the EGVFETs are used for high voltage applications (e.g., 20 volts (V) or more) and serve as I/O devices, and the nominal VFETs serve as analog devices.

Metallization is then performed to form contacts to the nominal VFET and EGVFET devices. For instance, the (nominal VFET and EGVFET) devices are buried in an interlayer dielectric (ILD) 3402. Contacts 3404/3410 are then formed in the ILD 3402 to the bottom source and drains of the nFET/pFET nominal VFET devices, respectively, and contacts 3412/3418 are formed in the ILD 3402 to the bottom source and drains of the nFET/pFET EGVFET devices, respectively. Contacts 3406/3408 are formed in the ILD 3402 to the top source and drains of the nFET/pFET nominal VFET devices, respectively, and contacts 3414/3416 are formed in the ILD 3402 to the top source and drains of the nFET/pFET EGVFET devices, respectively. According to an exemplary embodiment, the contacts 3404-3418 are formed by first patterning contact trenches in the ILD 3402, and then filling the contact trenches with a suitable contact metal such as copper (Cu), tungsten (W), titanium (Ti) and/or platinum (Pt).

A number of notable variants of the above-described process are contemplated herein. For instance, in one alternative embodiment—described by way of reference to FIGS. 35-39—a different process is proposed for patterning the fins whereby a single hardmask open is used to pattern the fin hardmasks for both the nominal VFET and EGVFET regions.

This alternative process begins in the same general manner as above wherein the doped epitaxial layers 104, 106, 108, and 110 are grown on the wafer 102 (see FIG. 1) and a hardmask stack 202 is formed on the wafer 102, over the doped epitaxial layers 104, 106, 108, and 110 (see FIG. 2). Accordingly, these like structures are numbered alike in the description below.

Figure 35:
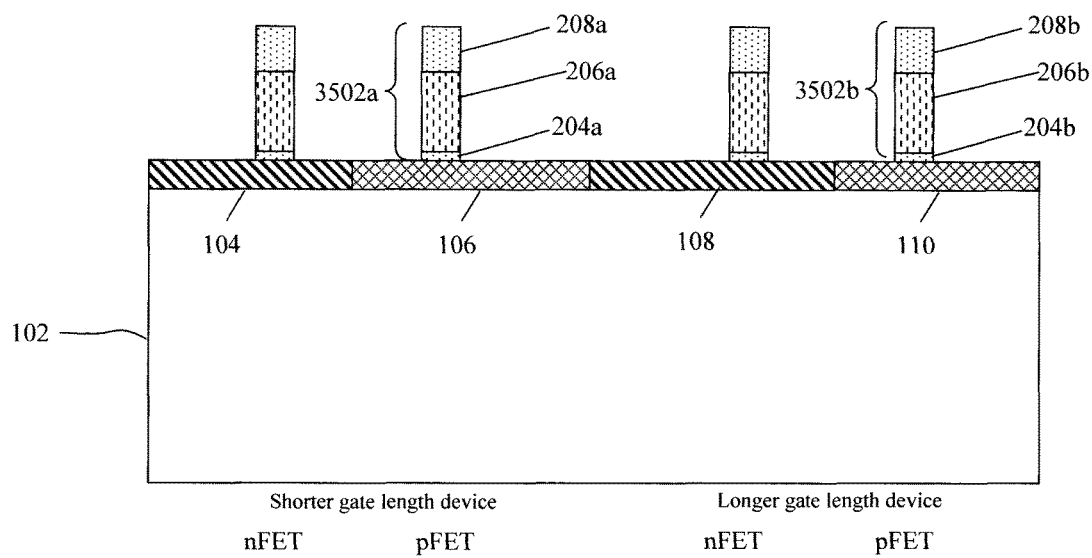
FIG. 35 is a cross-sectional diagram illustrating, according to an alternative embodiment which follows from FIG. 2, the hardmask stack having been patterned over the nominal and EGVFET regions of the wafer to form nominal and EGVFET fin hardmasks according to an embodiment of the present invention.

However, following from FIG. 2, as shown in FIG. 35 the hardmask 202 is then patterned over the first (nominal VFET) and second (EGVFET) regions of the wafer 102 to form a plurality of nominal VFET fin hardmasks 3502a and EGVFET fin hardmasks 3502b (wherein the constituent oxide layer 204/nitride layer 206/oxide layer 208 are now given reference numerals 204a/b, 206a/b, and 208a/b, respectively). The VFET/EGVFET fin hardmasks 3502a/b mark the footprint and location of at least one first (n-FET) and at least one second (p-FET) vertical fin channel in the nominal VFET/EGVFET regions of the wafer 102.

Figure 36:
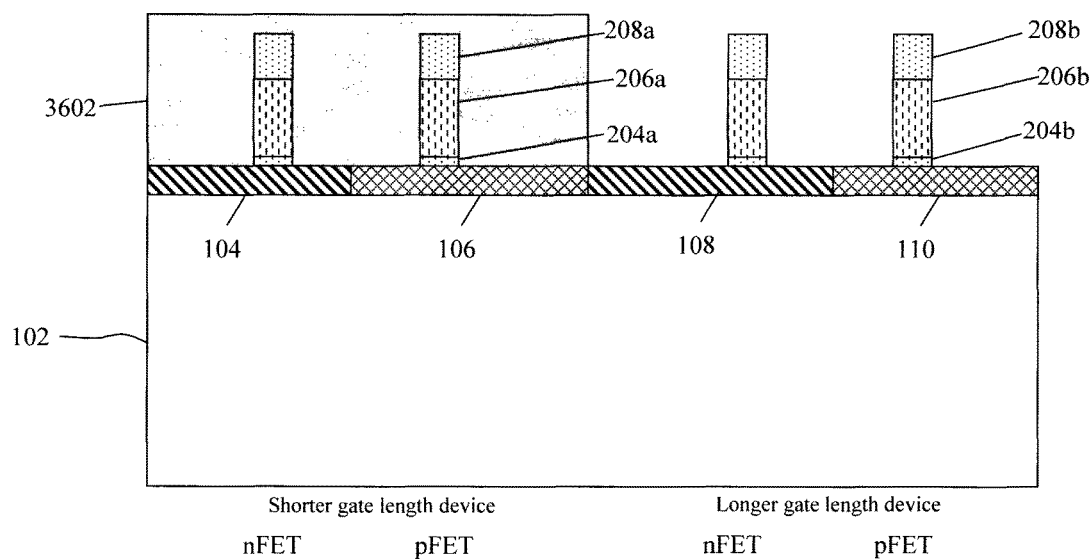
FIG. 36 is a cross-sectional diagram illustrating a (first) sacrificial layer having been used to selectively mask the nominal VFET fin hardmasks according to an embodiment of the present invention.
Figure 37:
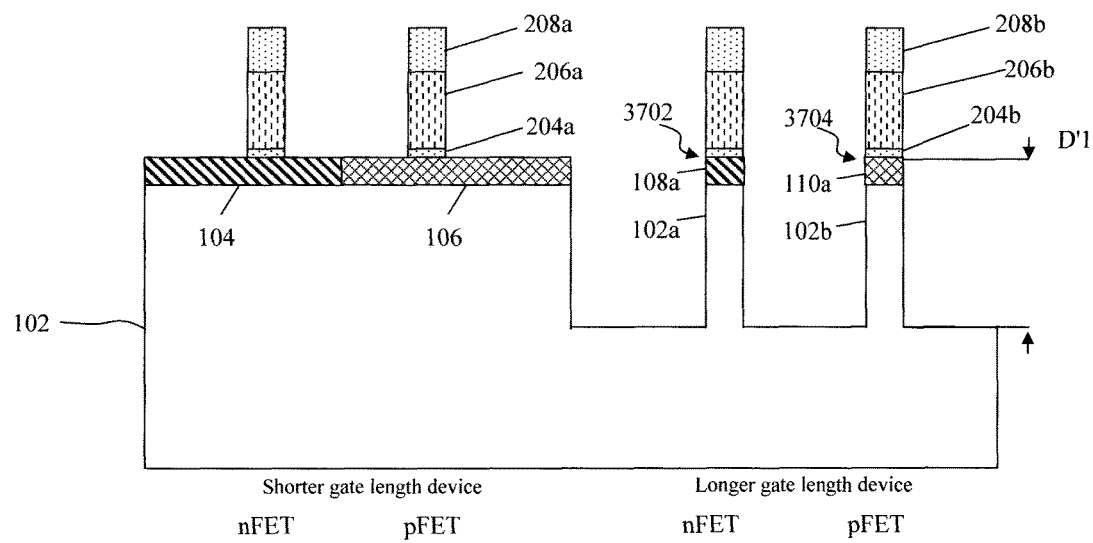
FIG. 37 is a cross-sectional diagram illustrating the EGVFET fin hardmasks having been used to pattern at least one first (nFET) fin and at least one second (pFET) fin in the EGVFET region of the wafer to a depth D'1, and the (first) sacrificial material having been removed according to an embodiment of the present invention.
Figure 38:
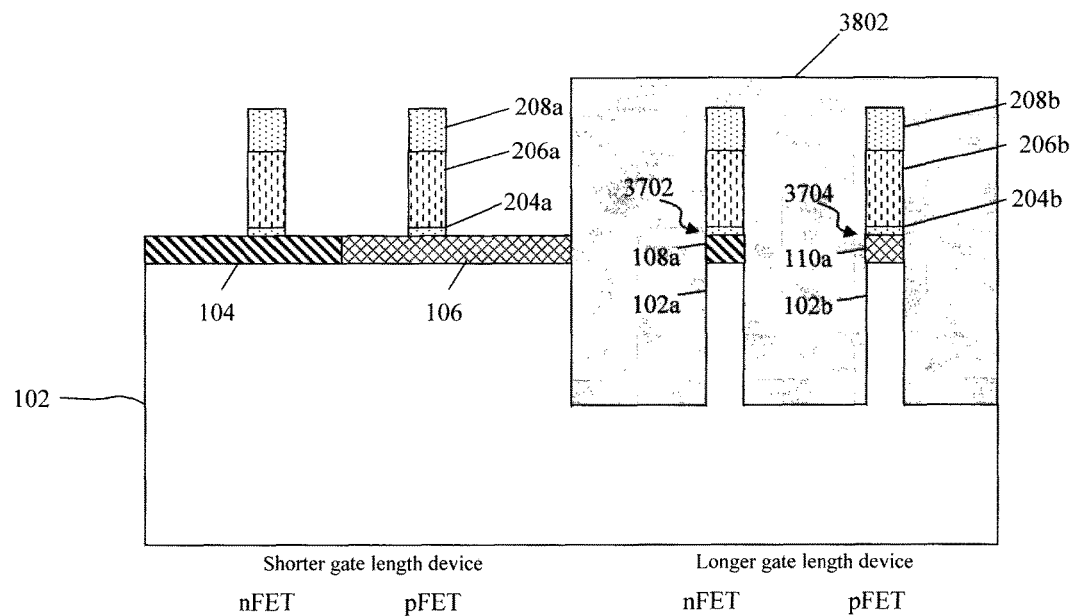
FIG. 38 is a cross-sectional diagram illustrating the nFET and pFET fins in the EGVFET region of the wafer having been buried in a (second) sacrificial layer according to an embodiment of the present invention.

In the same manner as above, the fin hardmasks 3502a/b are then used to separately pattern fins to different depths in the nominal VFET and EGVFET regions of the wafer 102. For instance, as shown in FIG. 36 a sacrificial layer 3602 (e.g., carbon and/or TiN) is used to selectively mask the nominal VFET fin hardmasks 3502a, and the EGVFET fin hardmasks 3502b are then used to partially pattern at least one first (n-FET) fin 3702 and at least one second (p-FET) fin 3704 in the second (EGVFET) region of the wafer 102. See FIG. 37. Following the etch of fins 3702/3704, the sacrificial layer 3602 is removed. As shown in FIG. 37, each fin 3702 includes a patterned portion 108a of (n-type) doped epitaxial layer 108 and a portion 102a of wafer 102, and each fin 3704 includes a patterned portion 110a of (p-type) doped epitaxial layer 110 and a portion 102b of wafer 102.

According to an exemplary embodiment, the fins 3702/3704 are patterned to a first depth D'1. See FIG. 37. As compared to the exemplary process above, the depth D'1 represents a full etch depth of the fins 3702/3704 (rather than merely a partial etch). Namely, these fins 3702/3704 will be masked during a subsequent etch of the fins in the first (nominal VFET) region.

Figure 39:
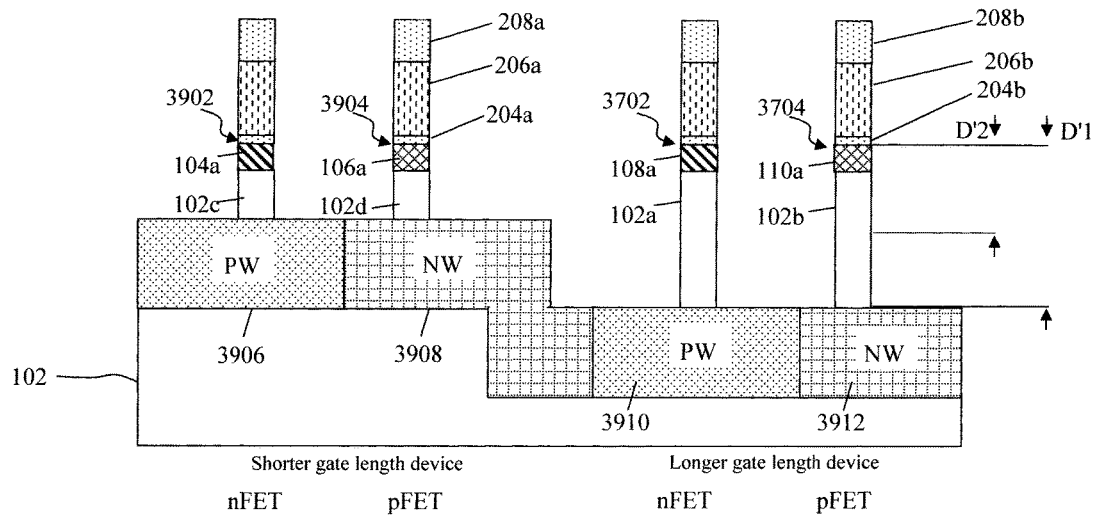
FIG. 39 is a cross-sectional diagram illustrating the nominal VFET fin hardmasks having been used to pattern at least one first (nFET) fin and at least one second (pFET) fin in the nominal VFET region of the wafer to a depth D'2<D'1, and p-wells having been formed beneath the nFET fins and n-wells having been formed beneath the pFET fins in the nominal and EGVFET regions of the wafer according to an embodiment of the present invention.

Thus, in order to permit selective processing of the first (nominal VFET) region of the wafer 102, the fins 3702/3704 are then buried in a sacrificial layer 3802 (e.g., carbon and/or TiN). See FIG. 38. This enables the fin hardmasks 3502a to be used to pattern at least one first (n-FET) fin 3902 and at least one second (p-FET) fin 3904 in the first (nominal VFET) region of the wafer 102. As shown in FIG. 39, each fin 3902 includes a patterned portion 104a of (n-type) doped epitaxial layer 104 and a portion 102c of wafer 102, and each fin 3904 includes a patterned portion 106a of (p-type) doped epitaxial layer 106 and a portion 102d of wafer 102.

At this stage in the process the fin etch is performed only in the first (nominal VFET) region of the wafer 102 to pattern the fins 3902/3904 in the first (nominal VFET) region of wafer 102 (e.g., to a depth D'2). Thus, as a result of this second fin etch being performed selectively in the nominal VFET region, fins 3902/3904 are present at a depth D'2 in the wafer 102 and fins 3702/3704 are present at a depth D'1 in the wafer 102, wherein D'1>D'2.

Portions 102a/102b of fins 3702/3704 and portions 102c/102d of fins 3902/3904 will serve as the vertical fin channels of the respective nFET/pFET EGVFET and nominal VFET devices. The portions 108a/110a of fins 3702/3704 and portions 104a/106a of fins 3902/3904 will serve as the top source and drains of the respective nFET/pFET nominal VFET and EGVFET devices.

In the same manner as above, ion implantation is then used to isolate the nFET and pFET devices in the nominal VFET and EGVFET regions from each other. See FIG. 39. As shown in FIG. 39, a p-type dopant is implanted into the wafer 102 beneath fins 3702 and 3902, and an n-type dopant is implanted into the wafer 102 beneath the fins 3704 and 3904, forming p-wells (PW) 3906/3910 and n-wells (NW) 3908/3912, respectively, beneath the corresponding fins. Suitable n-type and p-type dopants were provided above. The remainder of the process is the same as in the exemplary embodiment described above.

In another alternative embodiment—described by way of reference to FIGS. 40-46—the pitch of the fins is varied between the nominal VFET and EGVFET regions of the wafer 102. Fin pitch refers to the distance between a given point on one fin to the same point on the adjacent fin.

This alternative process begins in the same general manner as above wherein the doped epitaxial layers 104, 106, 108, and 110 are grown on the wafer 102 (see FIG. 1) and a hardmask stack 202 is formed on the wafer 102, over the doped epitaxial layers 104, 106, 108, and 110 (see FIG. 2). Accordingly, these like structures are numbered alike in the description below.

Figure 40:
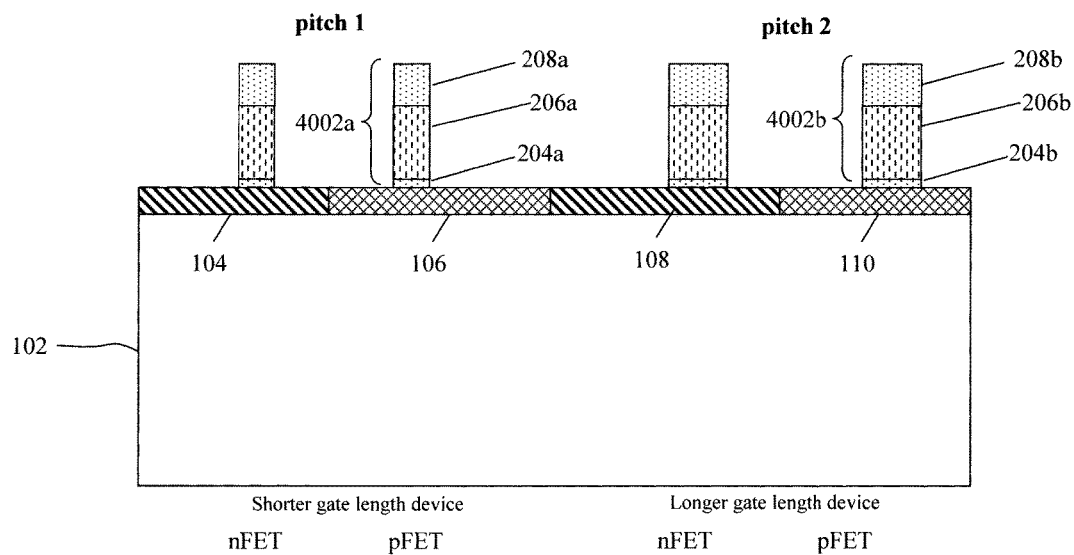
FIG. 40 is a cross-sectional diagram illustrating, according to another alternative embodiment which follows from FIG. 2, the hardmask stack having been patterned over the nominal and EGVFET regions of the wafer to form nominal fin hardmasks at a pitch 1 and EGVFET fin hardmasks at a pitch 2>pitch 1 according to an embodiment of the present invention.

Following from FIG. 2, as shown in FIG. 40 the hardmask 202 is then patterned over the first (nominal VFET) and second (EGVFET) regions of the wafer 102 to form a plurality of nominal VFET fin hardmasks 4002a at a first pitch 1 and a plurality of EGVFET fin hardmasks 4002b at a second pitch 2>pitch 1 (wherein the constituent oxide layer 204/nitride layer 206/oxide layer 208 are now given reference numerals 204a/b, 206a/b, and 208a/b, respectively). The VFET/EGVFET fin hardmasks 4002a/b mark the footprint and location of at least one first (n-FET) and at least one second (p-FET) vertical fin channel in the nominal VFET/EGVFET regions of the wafer 102. According to an exemplary embodiment, the size of the fin hardmasks 4002a in pitch 1 is narrower than the fin hardmasks 4002b in pitch 2. In that case, the fin size in pitch 2 would be wider than the fin size in pitch 1.

Figure 41:
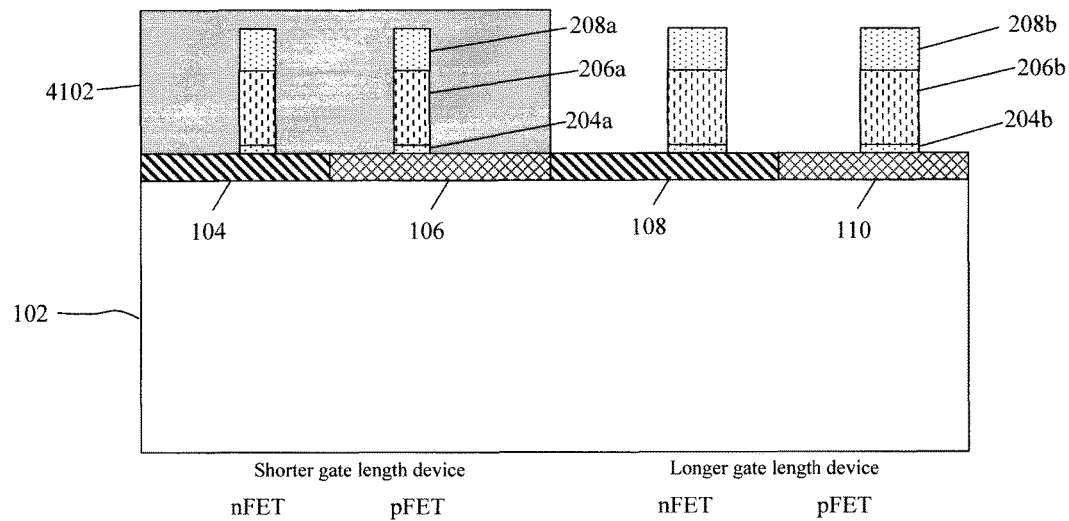
FIG. 41 is a cross-sectional diagram illustrating a (first) sacrificial layer having been used to selectively mask the nominal VFET fin hardmasks according to an embodiment of the present invention.
Figure 42:
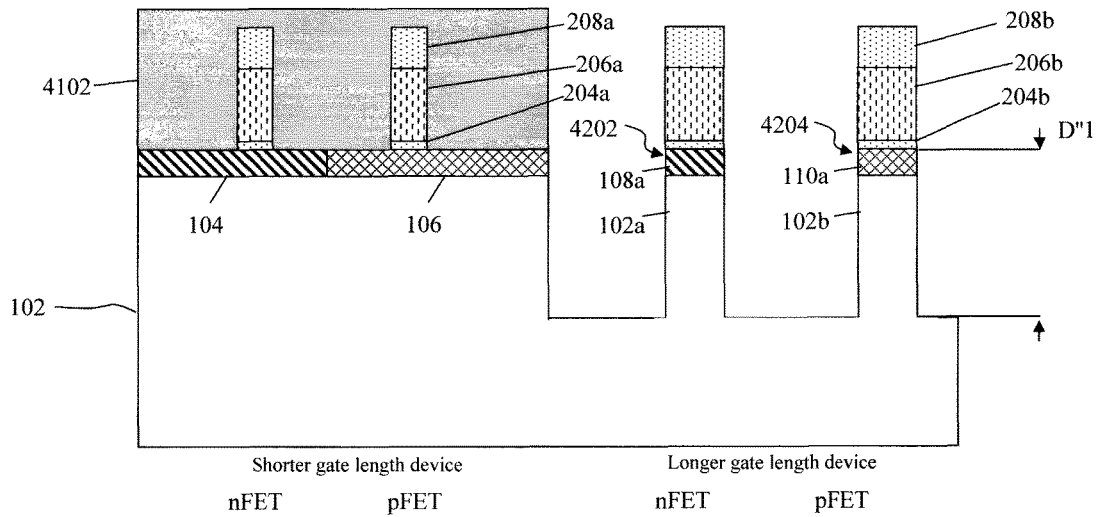
FIG. 42 is a cross-sectional diagram illustrating the EGVFET fin hardmasks having been used to pattern at least one first (nFET) fin and at least one second (pFET) fin in the EGVFET region of the wafer to a depth D"1, and the (first) sacrificial material having been removed according to an embodiment of the present invention.
Figure 43:
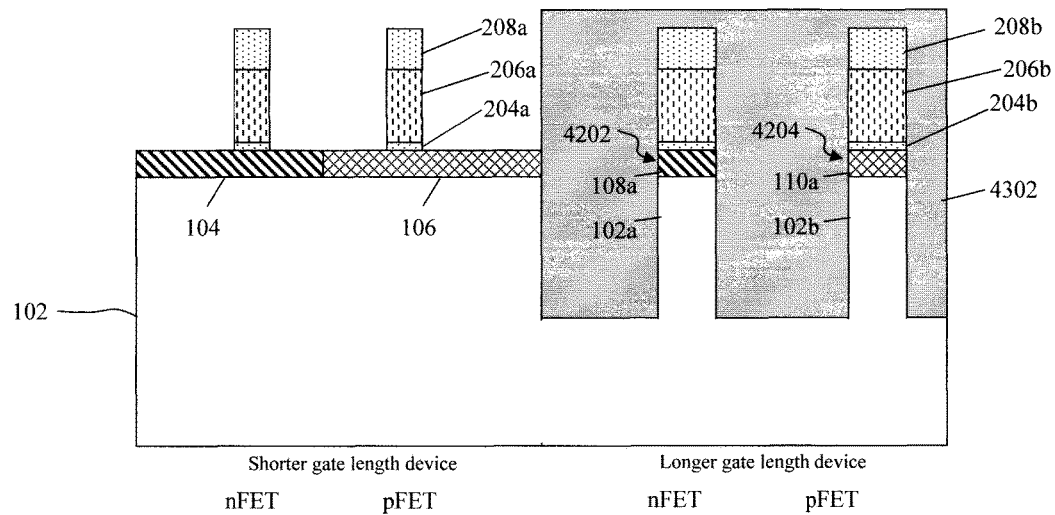
FIG. 43 is a cross-sectional diagram illustrating the nFET and pFET fins in the EGVFET region of the wafer having been buried in a (second) sacrificial layer according to an embodiment of the present invention.

In the same manner as above, the fin hardmasks 4002a/b are then used to separately pattern fins to different depths (and in this case at different pitches (i.e., at pitch 1 and pitch 2, wherein pitch 2>pitch 1) in the nominal VFET and EGVFET regions of the wafer 102. For instance, as shown in FIG. 41 a sacrificial layer 4102 (e.g., carbon and/or TiN) is used to selectively mask the nominal VFET fin hardmasks 4002*a*, and the EGVFET fin hardmasks 4002*b* are then used to pattern at least one first (n-FET) fin 4202 and at least one second (p-FET) fin 4204 in the second (EGVFET) region of the wafer 102. See FIG. 42. Following the etch of fins 4202/4204, the sacrificial layer 4102 is removed. As shown in FIG. 42, each fin 4202 includes a patterned portion 108*a* of (n-type) doped epitaxial layer 108 and a portion 102*a* of wafer 102, and each fin 4204 includes a patterned portion 110*a* of (p-type) doped epitaxial layer 110 and a portion 102*b* of wafer 102.

According to an exemplary embodiment, the fins 4202/4204 are patterned to a first depth D"1. See FIG. 42. As compared to the exemplary process above, the depth D"1 represents a full etch depth of the fins 4202/4204 (rather than merely a partial etch). Namely, these fins 4202/4204 will be masked during a subsequent etch of the fins in the first (nominal VFET) region.

Figure 44:
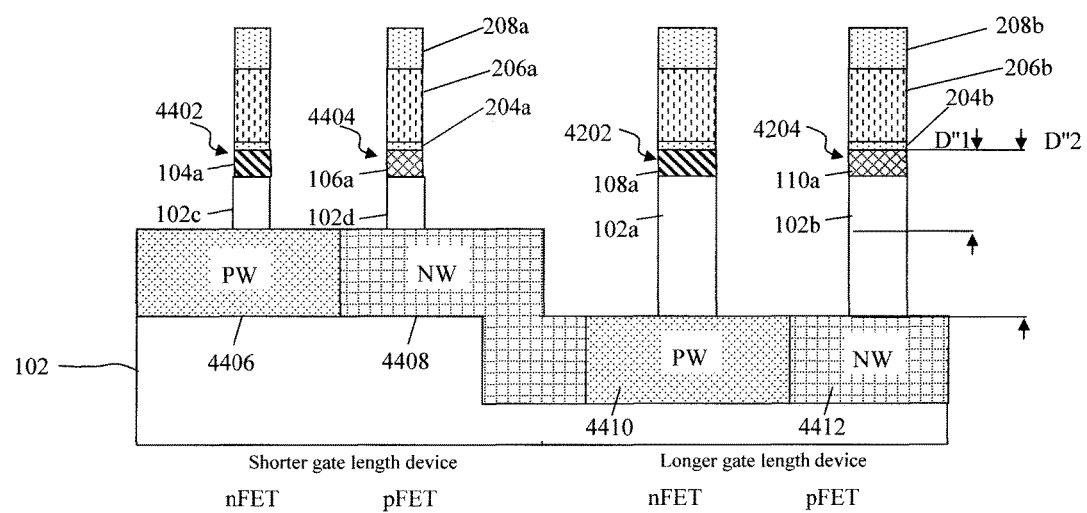
FIG. 44 is a cross-sectional diagram illustrating the nominal VFET fin hardmasks having been used to pattern at least one first (nFET) fin and at least one second (pFET) fin in the nominal VFET region of the wafer to a depth D"2<D"1 according to an embodiment of the present invention.

In order to permit selective processing of the first (nominal VFET) region of the wafer 102, the fins 4202/4204 are then buried in a sacrificial layer 4302 (e.g., carbon and/or TiN). See FIG. 43. This enables the fin hardmasks 4002*a* to be used to pattern at least one first (n-FET) fin 4402 and at least one second (p-FET) fin 4404 in the first (nominal VFET) region of the wafer 102. See FIG. 44. As shown in FIG. 44, each fin 4402 includes a patterned portion 104*a* of (n-type) doped epitaxial layer 104 and a portion 102*c* of wafer 102, and each fin 4404 includes a patterned portion 106*a* of (p-type) doped epitaxial layer 106 and a portion 102*d* of wafer 102.

At this stage in the process the fin etch is performed only in the first (nominal VFET) region of the wafer 102 to pattern the fins 4402/4404 in the first (nominal VFET) region of wafer 102 (e.g., to the depth D"2). Thus, as a result of this second fin etch being performed selectively in the nominal VFET region, fins 4402/4404 are present at a depth D"1 in the wafer 102 and fins 4202/4204 are present at a depth D"2 in the wafer 102, wherein D"2>D"1.

Portions 102*a*/102*b* of fins 4202/4204 and portions 102*c*/102*d* of fins 4402/4404 will serve as the vertical fin channels of the respective nFET/pFET EGVFET and nominal VFET devices. The portions 108*a*/110*a* of fins 4202/4204 and portions 104*a*/106*a* of fins 4402/4404 will serve as the top source and drains of the respective nFET/pFET nominal VFET and EGVFET devices.

In the same manner as above, ion implantation is then used to isolate the nFET and pFET devices in the nominal VFET and EGVFET regions from each other. As shown in FIG. 44, a p-type dopant is implanted into the wafer 102 beneath fins 4202 and 4402, and an n-type dopant is implanted into the wafer 102 beneath the fins 4204 and 4404, forming p-wells (PW) 4406/4410 and n-wells (NW) 4408/4412, respectively, beneath the corresponding fins. Suitable n-type and p-type dopants were provided above. According to an exemplary embodiment, the remainder of the process used is the same as in the first exemplary embodiment described above except that the fins have a different pitch. Variations are however also contemplated herein. For instance, according to another exemplary embodiment the process is modified to produce a thicker gate oxide on the EGVFET devices as compared to the nominal VFET devices. A thicker gate oxide for I/O devices is advantageous because high voltage can be applied without reliability issues.

Figure 45:
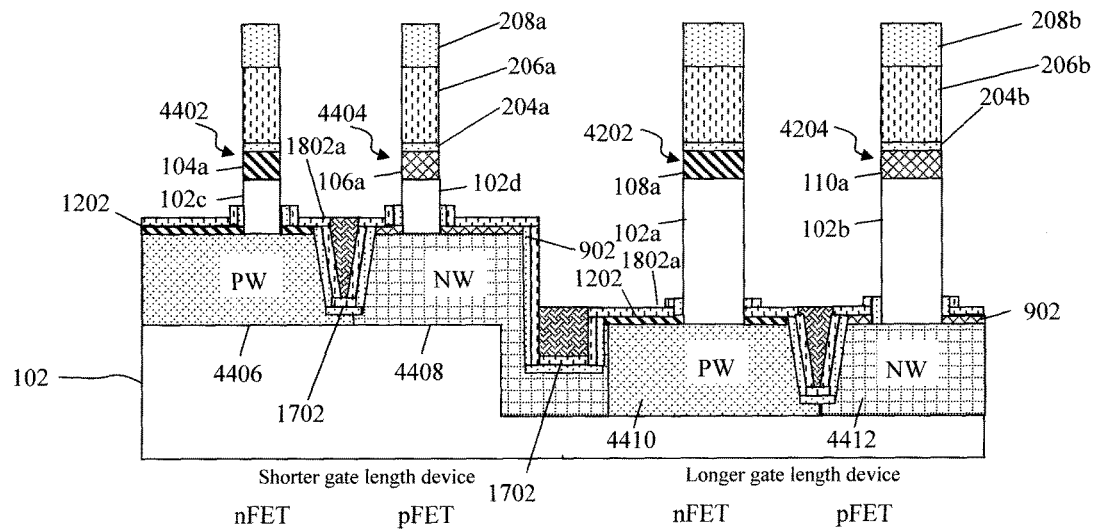
FIG. 45 is a cross-sectional diagram illustrating bottom source and drains having been formed at the base of fins, and bottom spacers having been formed on the bottom source and drains according to an embodiment of the present invention.
Figure 46:
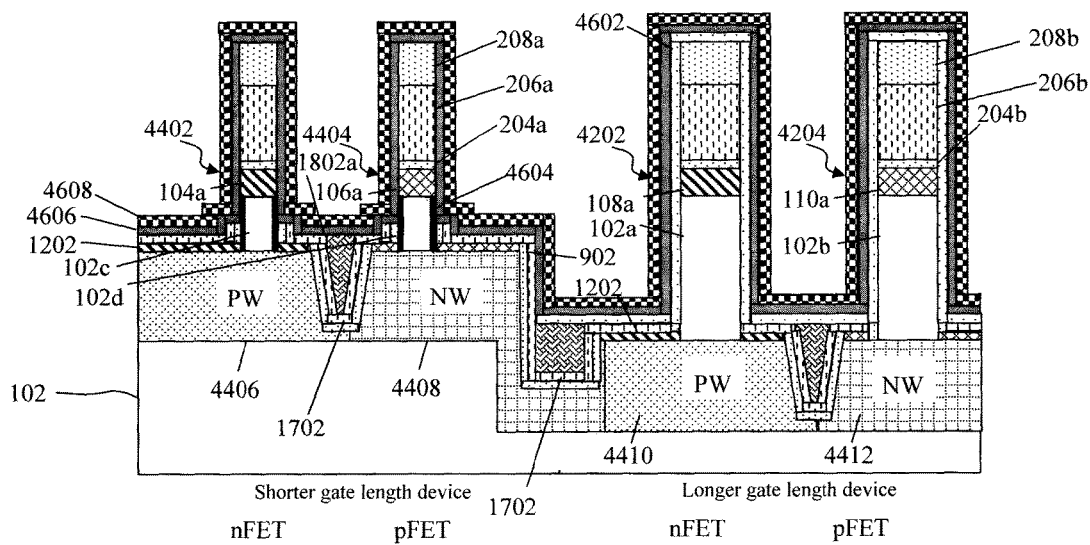
FIG. 46 is a cross-sectional diagram illustrating a (thicker) gate oxide having been formed alongside the EGVFET fins, and a (thinner) gate oxide having been formed alongside the nominal VFET fins according to an embodiment of the present invention.

This alternative process is shown illustrated in FIG. 45 and FIG. 46. FIG. 45 is analogous to FIG. 22 in the exemplary process flow above, except that the fins have a different pitch in FIG. 45. The same structures from above are numbered alike in FIGS. 45 and 46. Thus, as shown in FIG. 45, the bottom source and drains 902 and 1202 have been formed at the base of fins 4202/4204 and 4402/4404, bottom spacers 1802*a* have been formed on the bottom source and drains 902/1202, and so on.

Next, as shown in FIG. 46 a (thicker) gate oxide 4602 is formed alongside the fins 4202 and 4204, and a (thinner) gate oxide 4604 is formed alongside the fins 4402 and 4404. The thicker gate oxide 4602 can be deposited and a block patterning used to protect the thicker oxide devices to order remove the thicker gate oxide 4602 from the thinner oxide devices. According to an exemplary embodiment, gate oxide 4602 has a thickness T1 and gate oxide 4604 has a thickness T2, wherein T1>T2. According to an exemplary embodiment, the thickness T1 is from about 2 nm to about 5 nm, and ranges therebetween, and the thickness T2 is from about 0.5 nm to about 1.5 nm, and ranges therebetween. This gate oxide of two different thicknesses is what is referred to herein as a dual gate oxide. Following the formation of the dual gate oxide 4602/4604, a gate dielectric 4606 and a gate conductor 4608 are deposited. Suitable gate dielectrics and gate conductors were provided above. The remainder of the process remains the same as described above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical field effect transistor (VFET) device, the method comprising the steps of:
    patterning fins in a first region and a second region of a wafer, wherein the fins comprise at least one first fin patterned to a first depth in the wafer and at least one second fin patterned to a second depth in the wafer, wherein the second depth is greater than the first depth, wherein the fins are patterned in the wafer having at least one first pitch and at least one second pitch, wherein the at least one first fin is patterned in the wafer at a pitch 1, wherein the at least one second fin is patterned in the wafer at a pitch 2, and wherein pitch 2>pitch 1;
    forming bottom source and drains at a base of the fins;
    forming bottom spacers on the bottom source and drains;
    forming gates alongside the fins, wherein the gates formed alongside the at least one first fin have a first gate length Lg1, wherein the gates formed alongside the at least one second fin have a second gate length Lg2, and wherein Lg1<Lg2;
    forming top spacers over the gates at tops of the fins; and
    forming top source and drains over the top spacers.

2. The method of claim 1, further comprising the steps of:
    forming at least one first doped layer on the first region of the wafer and at least one second doped layer on the second region of the wafer; and
    patterning the fins in the wafer through the at least one first doped layer and the at least one second doped layer.

3. The method of claim 2, wherein the at least one first doped layer and the at least one second doped layer each comprises one epitaxial layer doped with an n-type dopant and another epitaxial layer doped with a p-type dopant.

4. The method of claim 1, wherein the step of patterning the fins in the wafer comprises the steps of:
    forming a hardmask stack on the wafer;

patterning the hardmask stack into at least one individual fin hardmask in the second region of the wafer;

partially patterning the at least one second fin to a depth D1 using the at least one individual fin hardmask in the second region of the wafer;

patterning the hardmask stack into at least one individual fin hardmask in the first region of the wafer;

patterning i) the at least one first fin to the depth D1 using the at least one individual fin hardmask in the first region of the wafer, and ii) to extend the at least one second fin to a depth D2 using the at least one individual fin hardmask in the second region of the wafer, wherein D2>D1.

5. The method of claim 4, wherein the hardmask stack comprises:
a first oxide layer;
a nitride layer disposed on the first oxide layer; and
a second oxide layer disposed on the nitride layer.

6. The method of claim 4, further comprising the step of:
selectively masking the at least one second fin that has been partially patterned.

7. The method of claim 1, wherein the step of patterning the fins in the wafer comprises the steps of:
forming a hardmask stack on the wafer;
patterning the hardmask stack into at least one individual fin hardmask in the first region of the wafer and into at least one individual fin hardmask in the second region of the wafer;
selectively masking the at least one individual fin hardmask in the first region of the wafer;
patterning the at least one second fin to a depth D'1 using the at least one individual fin hardmask in the second region of the wafer;
selectively masking the at least one second fin; and
patterning the at least one first fin to a depth D'2 using the at least one individual fin hardmask in the first region of the wafer, wherein D'2<D'1.

8. The method of claim 1, further comprising the step of:
forming at least one first ion implantation region in the first region of the wafer beneath the at least one first fin, and at least one second ion implantation region in the second region of the wafer beneath the at least one second fin.

9. The method of claim 8, wherein the at least one first ion implantation region and the at least one second ion implantation region each comprises an n-well and a p-well.

10. The method of claim 1, further comprising the steps of:
forming a trench in the wafer between the at least one first fin and the at least one second fin; and
filling the trench with a dielectric to isolate the at least one first fin from the at least one second fin.

11. The method of claim 1, wherein the step of forming the gates alongside the fins comprises the steps of:
depositing a conformal gate dielectric onto the fins; and
depositing a conformal gate conductor onto the conformal gate dielectric.

12. The method of claim 11, wherein the conformal gate dielectric comprises a high-κ gate dielectric selected from the group consisting of: hafnium oxide ($HfO_2$), lanthanum oxide ($La_2O_3$), and combinations thereof.

13. The method of claim 11, wherein the conformal gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

14. A VFET device, comprising:
fins patterned in a first region and a second region of a wafer, wherein the fins comprise at least one first fin patterned to a first depth in the wafer and at least one second fin patterned to a second depth in the wafer, wherein the second depth is greater than the first depth, wherein the fins are patterned in the wafer having at least one first pitch and at least one second pitch, wherein the at least one first fin is patterned in the wafer at a pitch 1, wherein the at least one second fin is patterned in the wafer at a pitch 2, and wherein pitch 2>pitch 1;
bottom source and drains disposed at a base of the fins;
bottom spacers disposed on the bottom source and drains;
gates alongside the fins, wherein the gates formed alongside the at least one first fin have a first gate length Lg1, wherein the gates formed alongside the at least one second fin have a second gate length Lg2, and wherein Lg1<Lg2;
top spacers over the gates at tops of the fins; and
top source and drains over the top spacers.

15. The VFET device of claim 14, further comprising:
at least one first ion implantation region present in the first region of the wafer beneath the at least one first fin; and
at least one second ion implantation region present in the second region of the wafer beneath the at least one second fin.

16. The VFET device of claim 15, wherein the at least one first ion implantation region and the at least one second ion implantation region each comprises an n-well and a p-well.

* * * * *